United States Patent
Yang et al.

(10) Patent No.: US 12,477,910 B2
(45) Date of Patent: Nov. 18, 2025

(54) DISPLAY PANEL AND METHOD OF MANUFACTURING THE SAME, DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Dongfang Yang, Beijing (CN); Yao Huang, Beijing (CN); Yue Long, Beijing (CN); Zhuoran Yan, Beijing (CN); Benlian Wang, Beijing (CN); Yuanjie Xu, Beijing (CN); Binyan Wang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/250,781

(22) PCT Filed: Mar. 1, 2022

(86) PCT No.: PCT/CN2022/078680
§ 371 (c)(1),
(2) Date: Apr. 27, 2023

(87) PCT Pub. No.: WO2023/164815
PCT Pub. Date: Sep. 7, 2023

(65) Prior Publication Data
US 2024/0324336 A1    Sep. 26, 2024

(51) Int. Cl.
*G09G 3/32* (2016.01)
*H10K 59/12* (2023.01)
(Continued)

(52) U.S. Cl.
CPC ....... *H10K 59/131* (2023.02); *H10K 59/1201* (2023.02); *H10K 59/121* (2023.02);
(Continued)

(58) Field of Classification Search
CPC ............. H10K 59/131; H10K 59/1201; H10K 59/121; H10K 59/351; H10K 59/353;
(Continued)

(56) References Cited

U.S. PATENT DOCUMENTS

2021/0333968 A1* 10/2021 Wu ........................ H10D 86/443
2021/0335920 A1* 10/2021 Hong ................... H10K 50/865
(Continued)

FOREIGN PATENT DOCUMENTS

| CN | 111446282 A | 7/2020 |
|---|---|---|
| CN | 111916486 A | 11/2020 |

(Continued)

OTHER PUBLICATIONS

PCT International Search Report and Written Opinion (w/ English translations) for corresponding PCT Application No. PCT/CN2022/091754, dated Dec. 5, 2022, 18 pages.

(Continued)

*Primary Examiner* — Pegeman Karimi
(74) *Attorney, Agent, or Firm* — Dority & Manning, P.A.

(57) ABSTRACT

A display panel includes a substrate, an insulating layer, a metal layer, a first transparent conductive layer and a second transparent conductive layer. The insulating layer has at least one via hole in each of a second sub-pixel region and a fourth sub-pixel region. The first transparent conductive layer includes a plurality of first transparent conductive lines. The second transparent conductive layer includes a Plurality of second transparent conductive lines. A total overlapping area between an orthographic projection of a first transparent conductive line on the substrate and (Continued)

orthogonal projections, on the substrate, of all via holes, in the second sub-pixel region, of the insulating layer is less than a total overlapping area between an orthographic projection of a second transparent conductive line on the substrate and orthogonal projections, on the substrate, of all via holes, in the fourth sub-pixel region, of the insulating layer.

20 Claims, 14 Drawing Sheets

(51) Int. Cl.
  *H10K 59/121* (2023.01)
  *H10K 59/131* (2023.01)
  *H10K 59/35* (2023.01)
  *H10K 59/65* (2023.01)
(52) U.S. Cl.
  CPC ......... *H10K 59/351* (2023.02); *H10K 59/353* (2023.02); *H10K 59/65* (2023.02)
(58) Field of Classification Search
  CPC ................. H10K 59/65; H10K 59/352; G09G 2300/0814; G09G 2300/0819; G09G 2300/0861; G09G 2300/0866; G09G 2320/045; G09G 3/3233; G09G 2300/0426; G09G 2300/0452; G09G 2300/0465; G09G 2300/0842; G09G 2310/08; G09G 2320/0233; G09G 2320/041; G09G 2330/021
  See application file for complete search history.

(56) References Cited

U.S. PATENT DOCUMENTS

| 2022/0013598 | A1* | 1/2022 | Park ..................... H10K 59/352 |
| 2022/0077276 | A1 | 3/2022 | Wang |
| 2022/0310742 | A1 | 9/2022 | Yi et al. |
| 2022/0320146 | A1 | 10/2022 | Huang et al. |
| 2022/0376028 | A1 | 11/2022 | Huang et al. |
| 2023/0045968 | A1 | 2/2023 | Wu et al. |
| 2023/0354661 | A1* | 11/2023 | Yang ..................... H10K 59/131 |

FOREIGN PATENT DOCUMENTS

| CN | 112038381 A | 12/2020 |
| CN | 112670302 A | 4/2021 |
| CN | 113178537 A | 7/2021 |
| CN | 114141851 A | 3/2022 |
| CN | 114639328 A | 6/2022 |
| JP | 2001102362 A | 4/2001 |

OTHER PUBLICATIONS

PCT International Search Report (w/ English translation) and Written Opinion for corresponding PCT Application No. PCT/CN2022/078680, dated Jul. 15, 2022, 8 pages.
Extended European Search Report for corresponding EP Application No. 22929453.3, dated Sep. 13, 2024, 10 pages.
U.S. Office Action for corresponding U.S. Appl. No. 18/034,396, dated Jul. 21, 2025, 18 pages.

* cited by examiner

DISPLAY PANEL AND METHOD OF MANUFACTURING THE SAME, DISPLAY APPARATUS

CROSS-REFERENCE TO RELATED APPLICATION

This application is a national phase entry under 35 USC 371 of International Patent Application No. PCT/CN2022/078680, filed on Mar. 1, 2022, which is incorporated herein by reference in its entirety.

TECHNICAL FIELD

The present disclosure relates to the field of display technologies, and in particular, to a display panel and a method of manufacturing the same, and a display apparatus.

BACKGROUND

In order to improve a screen-to-body ratio of a display apparatus (e.g., a smart device such as a mobile phone) and maintain an integrity of a screen, a technology of a full display with a camera (FDC) comes into being. However, a display effect in a region where an under-screen camera is located is relatively poor.

SUMMARY

In an aspect, a display panel is provided. The display panel has a display region. The display region includes a first region and a second region that are non-overlapping with each other. The first region includes a plurality of sub-pixel regions. The display panel includes a substrate, an insulating layer, a metal layer, a first transparent conductive layer and a second transparent conductive layer. The insulating layer is disposed on the substrate and has at least one via hole in a sub-pixel region. The metal layer is disposed on a side of the insulating layer away from the substrate and covers an inner wall of the at least one via hole in the sub-pixel region. The first transparent conductive layer is disposed on a side of the metal layer away from the substrate and includes a plurality of first transparent conductive lines that are arranged in a first direction and spaced apart from one another. A first transparent conductive line extends from a first sub-pixel region to the second region through a second sub-pixel region, and the first sub-pixel region and the second sub-pixel region are each one of the plurality of sub-pixel regions. The insulating layer has at least one via hole in the second sub-pixel region, and the metal layer covers an inner wall of the at least one via hole in the second sub-pixel region. The second transparent conductive layer is disposed on a side of the first transparent conductive layer away from the substrate and includes a plurality of second transparent conductive lines that are arranged in the first direction and spaced apart from one another. A second transparent conductive line extends from a third sub-pixel region to the second region through a fourth sub-pixel region. The third sub-pixel region and the fourth sub-pixel region are each one of the plurality of sub-pixel regions. The insulating layer has at least one via hole in the fourth sub-pixel region, and the metal layer covers an inner wall of the at least one via hole in the fourth sub-pixel region. A total overlapping area between an orthographic projection of the first transparent conductive line on the substrate and orthogonal projections, on the substrate, of all via holes, in the second sub-pixel region, of the insulating layer is less than a total overlapping area between an orthographic projection of the second transparent conductive line on the substrate and orthogonal projections, on the substrate, of all via holes, in the fourth sub-pixel region, of the insulating layer.

In some embodiments, the orthographic projection of the first transparent conductive line on the substrate is non-overlapping with the orthogonal projections, on the substrate, of all the via holes, in the second sub-pixel region, of the insulating layer. The orthographic projection of the second transparent conductive line on the substrate overlaps with an orthogonal projection, on the substrate, of at least part of the via holes, in the fourth sub-pixel region, of the insulating layer.

In some embodiments, an orthogonal projection, on the substrate, of at least part of the via holes, in the fourth sub-pixel region, of the insulating layer is located within the orthographic projection of the second transparent conductive line on the substrate.

In some embodiments, a maximum width of the second transparent conductive line in the fourth sub-pixel region is greater than a width of the first transparent conductive line in the second sub-pixel region.

In some embodiments, a portion of the second transparent conductive line in the fourth sub-pixel region includes a first section and a second section that are distributed in a second direction and connected to each other. The second direction is an extending direction of the second transparent conductive line. An orthographic projection of the first section on the substrate overlaps with an orthogonal projection, on the substrate, of at least part of the via holes, in the fourth sub-pixel region, of the insulating layer. An orthographic projection of the second section on the substrate is non-overlapping with the orthogonal projections, on the substrate, of all the via holes, in the fourth sub-pixel region, of the insulating layer. A maximum width of the first section is greater than a width of the second section.

In some embodiments, the maximum width of the first section is greater than a width of the first transparent conductive line in the second sub-pixel region; and/or a maximum width of the second section is equal to the width of the first transparent conductive line in the second sub-pixel region.

In some embodiments, an orthographic projection of the first transparent conductive line on the substrate is non-overlapping with orthographic projections of the plurality of second transparent conductive lines on the substrate.

In some embodiments, the plurality of first transparent conductive lines and the plurality of second transparent conductive lines are alternately arranged in the first direction.

In some embodiments, a distance, in a direction perpendicular to the substrate, between the second transparent conductive line and the insulating layer is greater than or equal to 4.5 μm.

In some embodiments, the display panel further includes a third transparent conductive layer. The third transparent conductive layer is located between the first transparent conductive layer and the second transparent conductive layer. The third transparent conductive layer includes a plurality of third transparent conductive lines that are arranged in the first direction and spaced apart from one another. A third transparent conductive line extends from a fifth sub-pixel region to the second region through a sixth sub-pixel region. An orthographic projection of the third transparent conductive line on the substrate is non-overlapping with orthogonal projections, on the substrate, of all via holes, in the sixth sub-pixel region, of the insulating layer. The fifth sub-pixel region and the sixth sub-pixel region are each one of the plurality of sub-pixel regions. The insulating layer has at least one via hole in the sixth sub-pixel region, and the metal layer covers an inner wall of the at least one via hole in the sixth sub-pixel region.

In some embodiments, the sixth sub-pixel region and the second sub-pixel region are a same sub-pixel region. In the second sub-pixel region, the orthographic projection of the third transparent conductive line on the substrate overlaps with an orthographic projection of the first transparent conductive line on the substrate.

In some embodiments, the display panel further includes a fourth transparent conductive layer. The fourth transparent conductive layer is located on the second transparent conductive layer. The fourth transparent conductive layer includes a plurality of fourth transparent conductive lines that are arranged in the first direction and spaced apart from one another. A fourth transparent conductive line extends from a seventh sub-pixel region to the second region through an eighth sub-pixel region, and the seventh sub-pixel region and the eighth sub-pixel region are each one of the plurality of sub-pixel regions. The insulating layer has at least one via hole in the eighth sub-pixel region, and the metal layer covers an inner wall of the at least one via hole in the eighth sub-pixel region.

An orthographic projection of the fourth transparent conductive line on the substrate is non-overlapping with orthogonal projections, on the substrate, of all via holes, in the eighth sub-pixel region, of the insulating layer; alternatively, the orthographic projection of the fourth transparent conductive line on the substrate overlaps with an orthogonal projection, on the substrate, of at least part of the via holes, in the eighth sub-pixel region, of the insulating layer.

In some embodiments, the first transparent conductive layer and the metal layer are adjacent conductive layers.

In some embodiments, the display panel further includes a first light-emitting device and a second light-emitting device. The first light-emitting device and the second light-emitting device are both located in the second region. The first light-emitting device is coupled to the first transparent conductive line. The second light-emitting device is coupled to the second transparent conductive line.

In some embodiments, the plurality of sub-pixel regions further include a plurality of ninth sub-pixel regions. The display panel further includes a plurality of third light-emitting devices located in the first region, and each third light-emitting device is coupled in a ninth sub-pixel region.

In another aspect, a display apparatus is provided. The display apparatus includes the display panel as described in any one of the above embodiments, and a sensor. The sensor is disposed on a non-display side of the display panel, and an orthographic projection of the sensor on the display panel overlaps with the second region.

In some embodiments, the orthographic projection of the first transparent conductive line on the substrate is non-overlapping with the orthogonal projections, on the substrate, of all the via holes, in the second sub-pixel region, of the insulating layer. The orthographic projection of the second transparent conductive line on the substrate overlaps with an orthogonal projection, on the substrate, of at least part of the via holes, in the fourth sub-pixel region, of the insulating layer.

In yet another aspect, a method of manufacturing a display panel is provided. The display panel has a display region; the display region includes a first region and a second region that are non-overlapping with each other, and the first region includes a plurality of sub-pixel regions. The method of manufacturing the display panel includes:

forming an insulating layer on a substrate, the insulating layer having at least one via hole in a sub-pixel region; forming a metal layer on a side of the insulating layer away from the substrate, the metal layer covering an inner wall of the at least one via hole; forming a first transparent conductive layer on a side of the metal layer away from the substrate, wherein the first transparent conductive layer includes a plurality of first transparent conductive lines that are arranged in a first direction and spaced apart from one another; a first transparent conductive line extends from a first sub-pixel region to the second region through a second sub-pixel region; an orthographic projection of the first transparent conductive line on the substrate is non-overlapping with orthogonal projections, on the substrate, of all via holes, in the second sub-pixel region, of the insulating layer; the first sub-pixel region and the second sub-pixel region are each one of the plurality of sub-pixel regions; the insulating layer has at least one via hole in the second sub-pixel region, and the metal layer covers an inner wall of the at least one via hole in the second sub-pixel region; and forming a second transparent conductive layer on a side of the first transparent conductive layer away from the substrate, wherein the second transparent conductive layer includes a plurality of second transparent conductive lines that are arranged in the first direction and spaced apart from one another; a second transparent conductive line extends from a third sub-pixel region to the second region through a fourth sub-pixel region; an orthographic projection of the second transparent conductive line on the substrate overlaps with an orthogonal projection, on the substrate, of at least part of via holes, in the fourth sub-pixel region, of the insulating layer; the third sub-pixel region and the fourth sub-pixel region are each one of the plurality of sub-pixel regions; the insulating layer has at least one via hole in the fourth sub-pixel region, and the metal layer covers an inner wall of the at least one via hole in the fourth sub-pixel region.

In some embodiments, forming the first transparent conductive layer on the side of the metal layer away from the substrate includes: forming a transparent conductive film on the side of the metal layer away from the substrate; forming a first positive photoresist film on a surface of the transparent conductive film: performing exposure, by using a first mask, and development on the first positive photoresist film to obtain a first photoresist pattern layer, the first mask including a plurality of first linear shielding bars; and removing a portion of the transparent conductive film not protected by the first photoresist pattern layer to obtain the first transparent conductive layer including the plurality of first transparent conductive lines. A first linear shielding bar corresponds to the first transparent conductive line. Forming the second transparent conductive layer on the side of the first transparent conductive layer away from the substrate includes: forming another transparent conductive film on the side of the first transparent conductive layer away from the substrate; forming a second positive photoresist film on a surface of the another transparent conductive film; performing exposure, by using a second mask, and development on the second positive photoresist film to obtain a second photoresist pattern layer, the second mask including a plurality of second linear shielding bars; and removing a portion of the another transparent conductive film not protected by the second photoresist pattern layer to obtain the second transparent conductive layer including the plurality of second transparent conductive lines. A second linear shielding bar corresponds to the second transparent conductive line: a maximum width of the second linear shielding bar corresponding to the fourth sub-pixel region is greater than a width of the first linear shielding bar corresponding to the second sub-pixel region.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
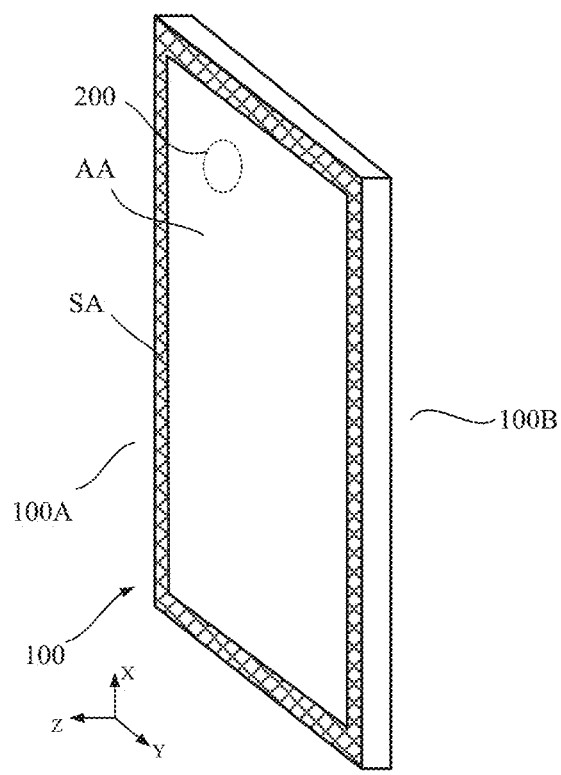
FIG. 1 is a structural diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phase "based on" as used herein is meant to be open and inclusive, since a process, a step, a calculation or other action that is "based on" one or more of stated conditions or values may, in practice, be based on additional conditions or values beyond those stated.

As used herein, the terms such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as "parallel", "perpendicular" or "equal" includes a stated condition and a condition similar to the stated condition, a range of the similar condition is within an acceptable range of deviation, and the acceptable range of deviation is determined by a person of ordinary skill in the art considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5; the term "perpendicular" includes absolute perpendicularity and approximate perpendicularity, and an acceptable range of deviation of the approximate perpendicularity may also be, for example, a deviation within 5°; the term "equal" includes absolute equality and approximate equality, and an acceptable range of deviation of the approximate equality may be that, for example, a difference between the two that are equal is less than or equal to 5% of either of the two.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus. The display apparatus is a product having a function of displaying images (including an image in stationary or an image in motion (which may be a video)). For example, the display apparatus may be any one of a display, a television, a billboard, a digital photo frame, a laser printer having a display function, a telephone, a mobile phone, a painted screen, a personal digital assistant (PDA), a digital camera, a portable camcorder, a view finder, a navigator, a vehicle, a large-area wall, an information inquiry device (e.g., a business inquiry device for a department of e-government, bank, hospital, electricity or the like) and a monitor. For another example, the display apparatus may be any one of a micro display, and a virtual reality (VR) device and an augmented reality (AR) device each including a micro display.

Figure 2:
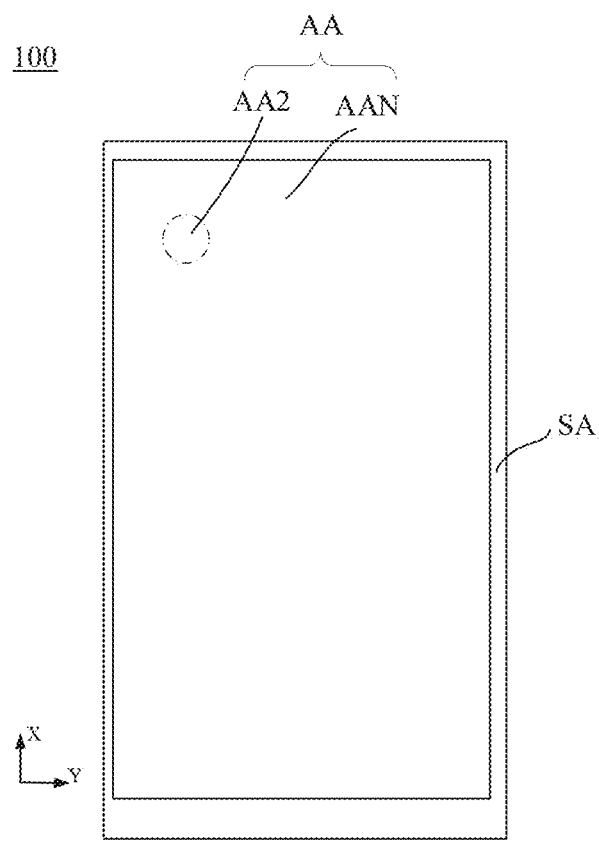
FIG. 2 is a front view of a display panel, in accordance with some embodiments.

FIG. 1 is a perspective view of the display apparatus. FIG. 2 is a front view of the display apparatus.

Referring to FIG. 1, the display apparatus may include a display panel 100 and a sensor 200. The display panel 100 is a flat panel capable of displaying images. For example, the display panel 100 may be referred to as a screen such as a liquid crystal display panel 100 or an organic light emitting diode (OLED) display panel 100. For example, the sensor 200 may be an infrared sensor, an ultrasonic sensor, a light detection and ranging (LIDAR) sensor, a radio detection and ranging (Radar) sensor, a camera sensor or the like.

Referring to FIG. 1, the display panel 100 has a display side 100A and a non-display side 100B. The display side 100A is a side of the display panel 100 capable of displaying images. In a case where the human eye is at the display side 100A, an image displayed by the display panel 100 may be observed. The non-display side 100B is opposite to the display side 100A. The sensor 200 is disposed on the non-display side 1008 of the display panel 100. Thus, the sensor 200 may be referred to as an under-screen sensor. Since the sensor 200 needs to receive light signals transmitted through the display panel 100 from the outside, the display panel 100 needs to have a relatively high light transmittance in a region corresponding to the sensor 200. Based on this, the display panel 100 may have a display region AA and a peripheral region SA. In FIG. 1, the direction X is an extending direction of a side, such as a long side, of the display region AA; the direction Y is an extending direction of another side, such as a short side, of the display region AA; the direction Z is a direction perpendicular to the display region AA. Hereinafter, the direction X, the direction Y and the direction Z in each figure are respectively defined in a same manner.

Referring to FIG. 2, the peripheral region SA is located on at least one side (e.g., one side, or a periphery including an upper side, a lower side, a left side and a right side) outside the display region AA. The display region AA may include a sensor corresponding region (which is referred to as a second region below for a consistent expression herein) AA2 and a sensor non-corresponding region AAN that are non-overlapping with each other. A light transmittance in the second region AA2 is higher than a light transmittance in the sensor non-corresponding region AAN.

An orthographic projection of the sensor 200 on the display panel 100 overlaps with the second region AA2, so that relatively much light may pass through the display panel 100 and be received by the sensor 200. For example, a part of the orthographic projection of the sensor 200 on the display panel 100 is located within the second region AA2. For another example, all of the orthographic projection of the sensor 200 on the display panel 100 is located within the second region AA2. For yet another example, an orthographic projection, on the display panel 100, of a photosensitive window of the sensor 200 is located within the second region AA2. The sensor non-corresponding region AAN is a region, other than the second region AA2, in the display region AA.

Some embodiments of the present disclosure provide a display panel, and the display panel may be included in the display apparatus.

Referring to FIG. 2, the display panel 100 includes a plurality of sub-pixels provided in the display region AA. A sub-pixel is a minimum portion of which luminance is controllable. As an example, the plurality of sub-pixels include first color sub-pixels each configured to emit light of a first color, second color sub-pixels each configured to emit light of a second color and third color sub-pixels each configured to emit light of a third color; the first color, the second color and the third color may be three primary colors. For example, the first color, the second color and the third color are respectively a red color, a green color and a blue color; correspondingly, the plurality of sub-pixels include red sub-pixels, green sub-pixels and blue sub-pixels. As another example, the plurality of sub-pixels may include fourth sub-pixels each emitting white light.

Figures 3, 4A:
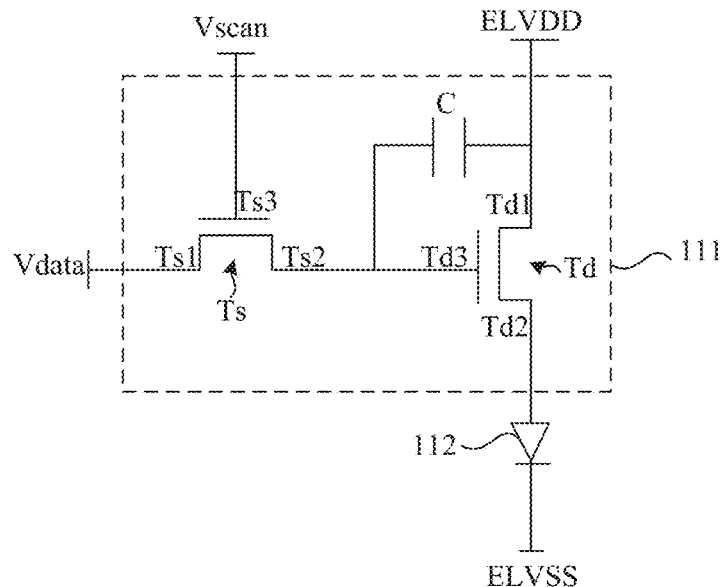
FIG. 3 is an equivalent circuit diagram of a sub-pixel, in accordance with some embodiments.
FIG. 4A is a diagram showing a distribution of regions in a display region, in accordance with some embodiments.

FIG. 3 shows an equivalent circuit diagram of a sub-pixel. Referring to FIG. 3, in some embodiments, a sub-pixel 110 (e.g., each sub-pixel 110) may include a pixel driving circuit 111 and a light-emitting device 112, and the pixel driving circuit 111 is coupled to the light-emitting device 112 and is configured to drive the light-emitting device 112 to emit light. In the embodiments of the present disclosure, a region occupied by the pixel driving circuit 111 is referred to as a sub-pixel region.

For example, the light-emitting device 112 may be any one of a light emitting diode (LED), an OLED, a quantum dot light emitting diode (QLED) and a small-sized LED (including a mini LED or a micro LED). The light-emitting device 112 (e.g., the OLED or the QLED) includes a cathode and an anode. In a case where a current is supplied between the anode and the cathode, the light-emitting device 112 emits light.

A structure of the pixel driving circuit 111 varies, which may be set according to actual needs. For example, the pixel driving circuit 111 may include at least two transistors (which are each represented by T) and at least one capacitor (which is represented by C). For example, the pixel driving circuit 111 may have a structure of "2T1C", "6T1C", "7T1C", "6T2C" or "7T2C".

For example, as shown in FIG. 3, the pixel driving circuit 111 has the structure of "2T1C", which includes a switching transistor Ts, a driving transistor Td and a capacitor C. The switching transistor Ts is configured to be turned on (that is, there is a conductive path between a source Ts1 and a drain Ts2) in response to a scan signal Vscan received by a gate Ts3 and being at an effective level, transmit a data signal Vdata to a gate Td3 of the driving transistor Td, and charge the capacitor C. The driving transistor Td is configured to control, in response to a voltage of the gate Td3, a magnitude of a current flowing through a source Td1 and a drain Td2. The light-emitting device 112 and the driving transistor are connected in series, so that luminance of the light-emitting device 112 varies with the magnitude of the current. In order to enable the pixel driving circuit 111 to operate, the display panel 100 further includes a plurality of signal lines such as data lines each used for transmitting a data signal Vdata, scan lines each used for transmitting a scan signal Vscan, first power supply lines each used for transmitting a first power supply voltage signal ELVDD (e.g., which is at a high voltage) and second power supply lines each used for transmitting a second power supply voltage signal ELVSS (e.g., which is at a low voltage).

Figure 4B:
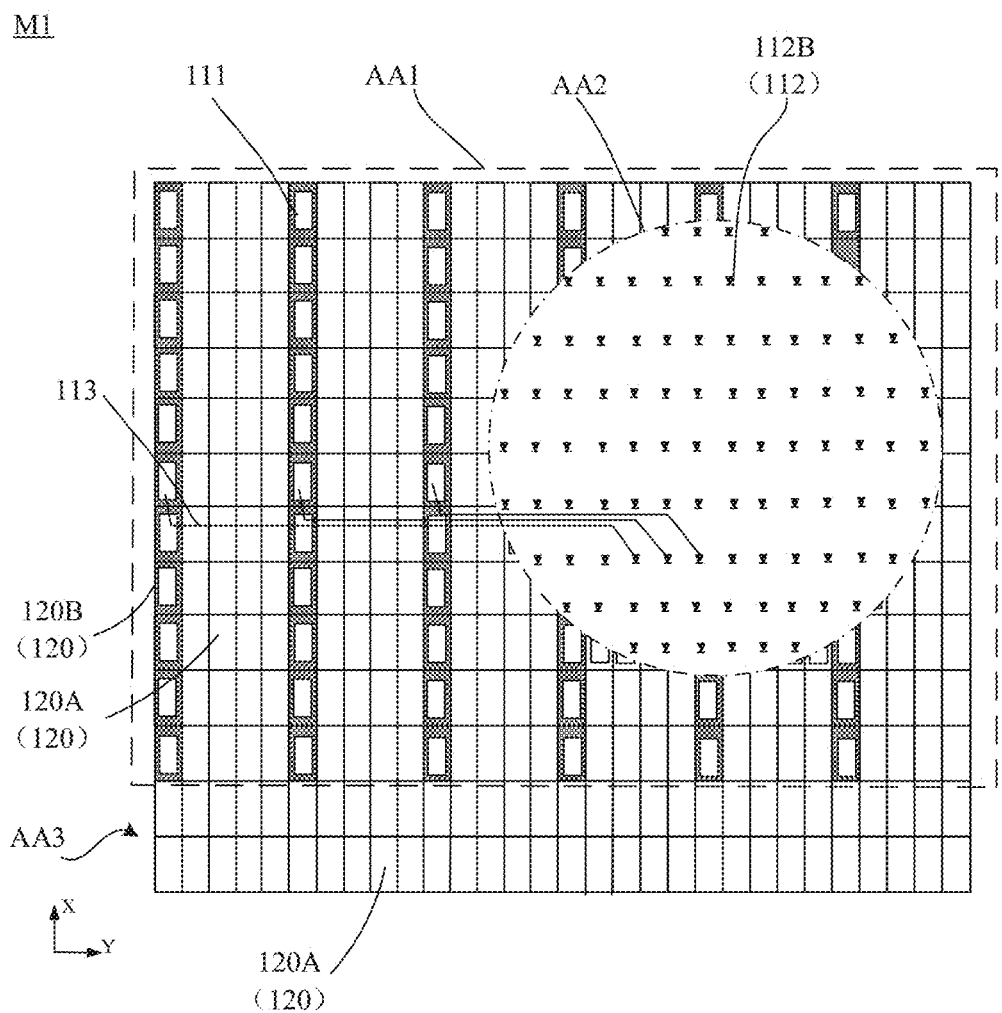
FIG. 4B is an enlargement view of the region M1 in FIG. 4A.
Figure 5:
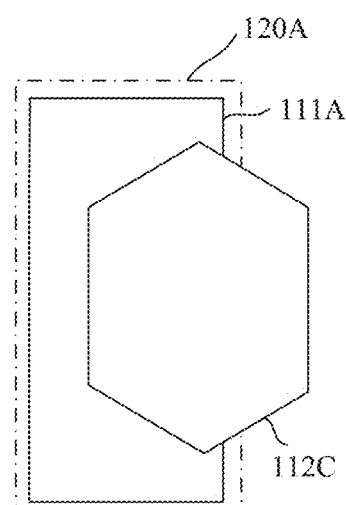
FIG. 5 is a schematic diagram showing positions of both a pixel driving circuit in a normal sub-pixel region and a light-emitting device to which the pixel driving circuit is coupled, in accordance with some embodiments.
Figure 6:
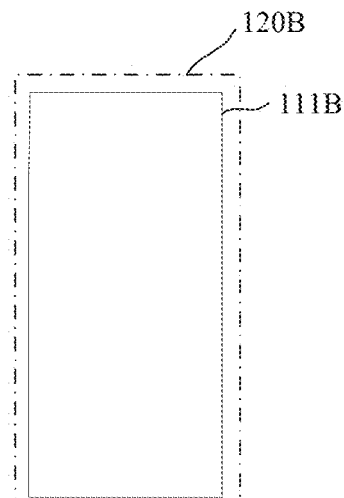
FIG. 6 is a block diagram showing a structure of a display panel in a dummy sub-pixel region, in accordance with some embodiments.

FIG. 4A is a diagram showing a distribution of regions in the display region; FIG. 4B is a diagram showing a distribution of a plurality of sub-pixel regions in the display region. FIG. 5 is a schematic diagram showing positions of a pixel driving circuit in a normal sub-pixel region and a light-emitting device coupled to the pixel driving circuit. FIG. 6 is a block diagram showing a structure of the display panel in a dummy sub-pixel region.

In some embodiments, referring to FIGS. 4A and 4B, the display region AA of the display panel 100 may include a first region AA1 and the second region AA2. The first region AA1 is located on at least one side (e.g., one side, or a periphery including an upper side, a lower side, a left side and a right side) outside the second region AA2. The first region AA1 may be located in the sensor non-corresponding region AAN in FIG. 2.

The first region AA1 includes sub-pixel regions 120 arranged in an array. The sub-pixel regions 120 in the first region AA1 are a part of all sub-pixel regions 120 in the display region AA. The sub-pixel regions 120 in the first region AA1 may include normal sub-pixel regions 120A and dummy sub-pixel regions 120B. Referring to FIG. 5, the display panel 100 is provided therein with a pixel driving circuit 111A in a normal sub-pixel region 120A, a light-emitting device 112C coupled to the pixel driving circuit 111A and the pixel driving circuit 111A are both located in the first region AA1, and all or a portion of the light-emitting device 112C may be located in the normal sub-pixel region 120A. With reference to FIGS. 4B and 6, the display panel 100 is provided therein with another pixel driving circuit 111B in a dummy sub-pixel region 120B, and a light-emitting device 112B coupled to the another pixel driving circuit 111B is located in the second region AA2.

With continued reference to FIG. 48, the second region AA2 is provided therein with light-emitting devices 112B arranged in an array. The light-emitting devices 112B in the second region AA2 are each coupled to a respective pixel driving circuit 111B in a respective dummy sub-pixel region 120B in the first region AA1 and driven to emit light by the respective pixel driving circuit 111B. The light-emitting devices 112B in the second region AA2 may be each coupled to the respective pixel driving circuit 111B in the respective dummy sub-pixel region 120B in the first region AA1 via conductive line(s) 113 (e.g., transparent conductive line(s)). In order to improve the clarity of the figure, only 3 conductive lines 113 are shown in FIG. 48. In these embodiments, each light-emitting device 112B in the second region AA2 may be coupled to a respective pixel driving circuit 111B in a respective dummy sub-pixel region 120B in the first region AA1 via at least one conductive line 113. There is no pixel driving circuit 111B in the second region AA2, so that blocking, by the pixel driving circuit 111B, of the light in the second region AA2 is ameliorated. As a result, the light transmittance in the second region AA2 is improved.

With continued reference to FIGS. 4A, 4B and 5, in addition to the first region AA1 and the second region AA2, the display region AA of the display panel 100 further includes a third region AA3. The third region AA3 includes sub-pixel regions 120 arranged in an array, and the sub-pixel regions 120 may be each a normal sub-pixel region 120A. A pixel driving circuit 111A located in a sub-pixel region 120 and a light-emitting device 112C coupled to the pixel driving circuit 111A are both located in the third region AA3.

In order to achieve the coupling between the pixel driving circuit 111 and the light-emitting device 112, some embodiments of the present disclosure provide a display panel.

Figure 7:
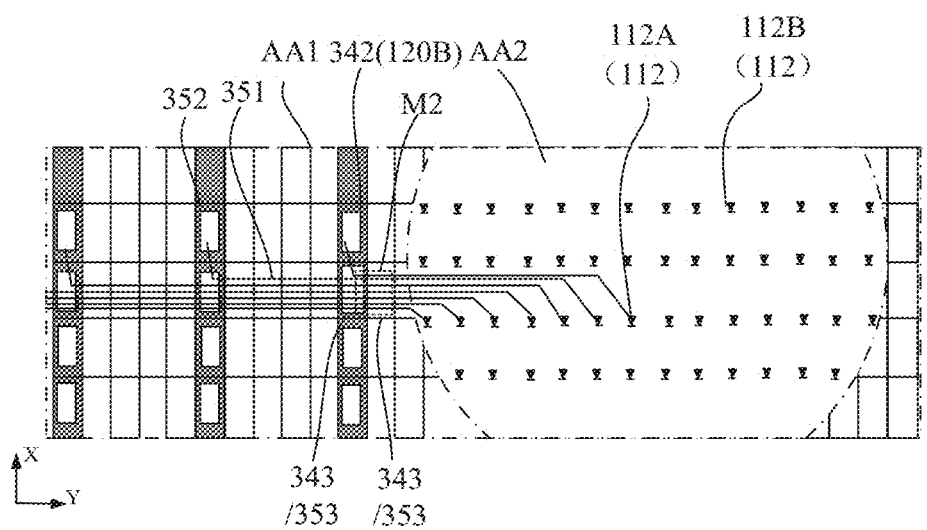
FIG. 7 is a partial top view of a display panel, in accordance with some embodiments.
Figure 8:
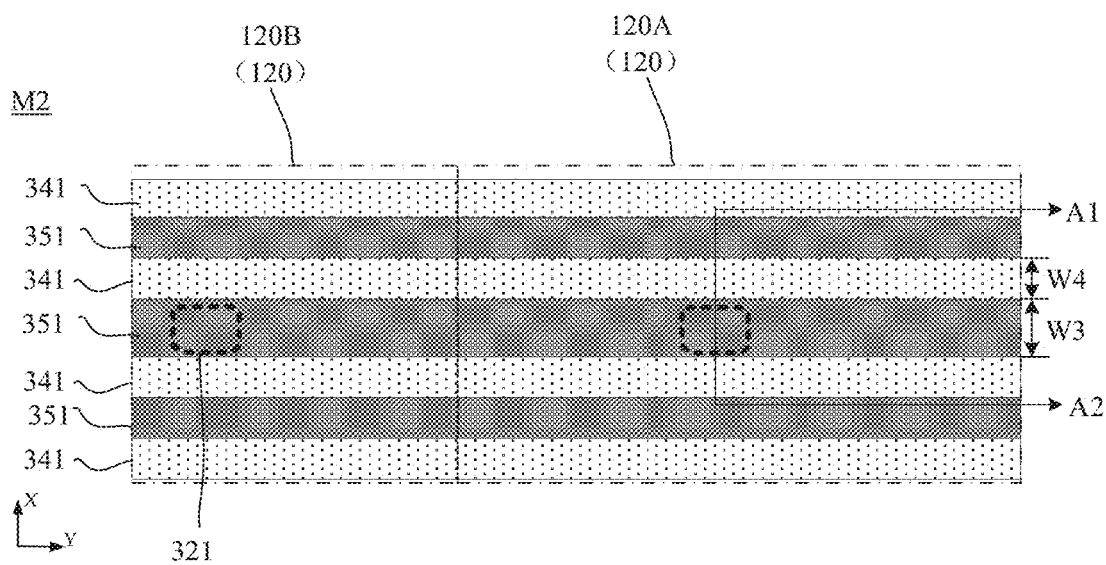
FIG. 8 is an enlargement view of the region M2 in FIG. 7.
Figure 9:
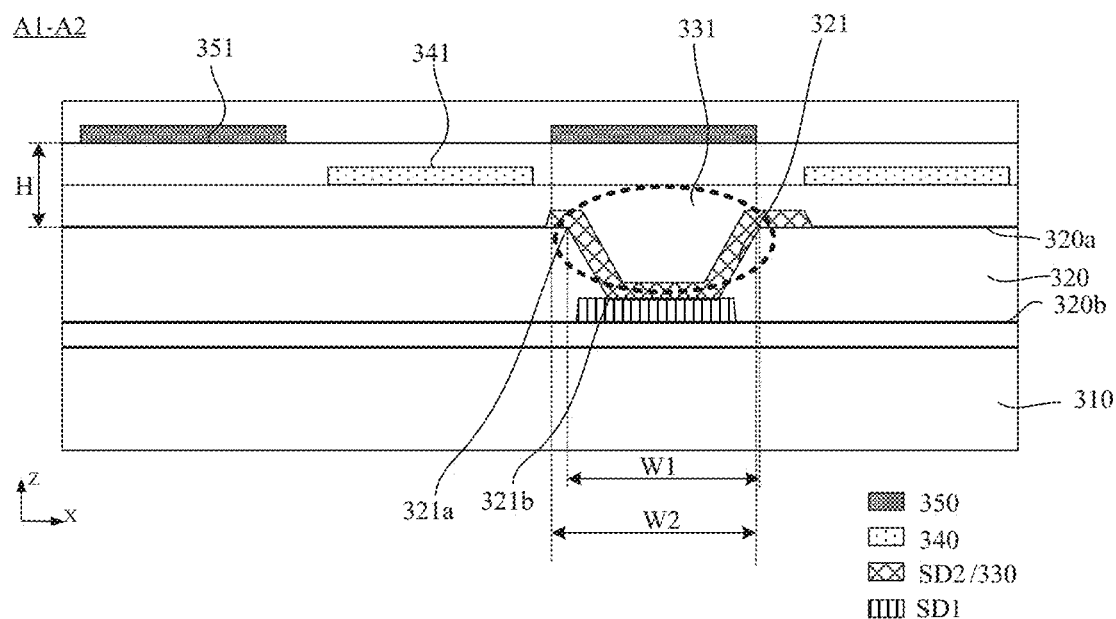
FIG. 9 is a sectional view of the display panel shown in FIG. 8 taken along the line A1-A2.

FIG. 7 is a partial top view of the display panel. FIG. 8 is an enlargement view of the region M2 in FIG. 7. FIG. 9 is a sectional view of the display panel shown in FIG. 8 taken along the line A1-A2.

Referring to FIG. 9, the display panel 100 includes a substrate 310, an insulating layer 320, a metal layer 330, a first transparent conductive layer 340 and a second transparent conductive layer 350.

The substrate 310 may be a rigid substrate or a flexible substrate. The rigid substrate includes, for example, at least one of a glass substrate, a polymethyl methacrylate (PMMA) substrate, a quartz substrate and a metal substrate. The flexible substrate may include, for example, at least one of a polyethylene terephthalate (PET) substrate, a polyethylene naphthalate two formic acid glycol ester (PEN) substrate and a polyimide (PI) substrate.

The display panel 100 may include a plurality of pattern layers each made of a metal material, and the metal material may include at least one of metal such as copper (Cu), aluminium (Al), silver (Ag), molybdenum (Mo) or chromium (Cr), and alloy of these metals. The pattern layers may be arranged in a thickness direction of the display panel 100. The metal layer 330 is any pattern layer, other than a pattern layer closest to the substrate 310, of the pattern layers.

For example, the display panel 100 may include a gate metal layer and a source-drain metal layer that are arranged in a direction away from the substrate 310. The gate metal layer includes scan lines. The source-drain metal layer includes data lines and first power supply lines, and may further include, for example, sources and/or drains of some transistors. In this case, the metal layer may be the source-drain metal layer. The source-drain metal layer may be coupled to an active layer below the source-drain metal layer. Herein, the directional phrases "above" and "below" refer to a side away from the substrate 310 and a side proximate to the substrate 310, respectively.

For another example, referring to FIG. 9, the display panel 100 may include a gate metal layer, a first source-drain metal layer SD1 and a second source-drain metal layer SD2 that are arranged in a direction away from the substrate 310. The gate metal layer includes scan lines. The first source-drain metal layer includes data lines, and may further include, for example, sources and/or drains of some transistors. The second source-drain metal layer includes first power supply lines. In this case, the metal layer 330 may be the first source-drain metal layer SD1 or the second source-drain metal layer SD2. The first source-drain metal layer SD1 may be coupled to an active layer therebelow. The second source-drain metal layer SD2 may be coupled to the first source-drain metal layer SD1.

With continued reference to FIG. 9, the insulating layer 320 is a layer located on a side of the metal layer 330 proximate to the substrate 310, adjacent to the metal layer 330 and made of an insulating material. The insulating material may include at least one of an inorganic insulating material (e.g., silicon oxide ($SiO_x$), silicon nitride ($SiN_x$) or silicon oxynitride (SiON)) and an organic insulating material. For example, the insulating layer 320 may be of a single-layer structure, or may be of a multi-layer structure in which materials of at least two layers of the multiple layers may be different. The insulating layer 320 has at least one via hole 321 (one or more via holes 321) in a sub-pixel region 120. The via hole 321 is a hole penetrating both an upper surface 320a (a surface away from the substrate 310) and a lower surface 320b (a surface proximate to the substrate 310) of the insulating layer 320. The via hole 321 is generally in a shape, of which an upper opening 321a (an opening of the via hole 321 located in the upper surface 320a of the insulating layer) is relatively large and a lower opening 321b (an opening of the via hole 321 located in the lower surface 320b of the insulating layer) is relatively small, similar to a funnel.

With continued reference to FIG. 9, the metal layer 330 is disposed on a surface of the insulating layer 320 away from the substrate 310. That is, the metal layer 330 is disposed on the upper surface 320a of the insulating layer 320. The metal layer 330 covers an inner wall of at least one (e.g., all or a part) of via holes 321, located in a sub-pixel region 120 (e.g., each sub-pixel region 120), of the insulating layer 320. The metal layer 330 is coupled to a conductive layer (i.e., a layer having conductive properties, such as a pattern layer 330A made of a metal material) or an active layer below the insulating layer 320 through the via holes 321. For example, the metal layer 330 may be the second source-drain metal layer SD2, the insulating layer 320 may include an inorganic insulating material film and an organic insulating material film located above an inorganic insulating material film, and the second source-drain metal layer SD2 is coupled to the first source-drain metal layer SD1 through some via holes 321 in the insulating layer 320. The via hole 321 is in the shape similar to the funnel, so that a portion, covering the inner wall of the via hole 321, of the metal layer 330 is of a structure 331 similar to a concave mirror. The structure 331 similar to the concave mirror has a function of gathering light above the via hole 321.

The first transparent conductive layer 340 is a conductive layer made of a transparent conductive material, which improves at least the light transmittance in the second region AA2. For example, the transparent conductive material may include at least one of metal oxides such as indium tin oxide (ITO) and indium zinc oxide (IZO). The first transparent conductive layer 340 is disposed on a side of the metal layer 330 away from the substrate 310, i.e., located above the metal layer 330.

With continued reference to FIG. 9, the first transparent conductive layer 340 includes a plurality of first transparent conductive lines 341. The plurality of first transparent conductive lines 341 are arranged in a first direction and spaced apart from one another. The first direction may be perpendicular to an extending direction of the first transparent conductive lines 341. Alternatively, the first direction may be a direction in which rows or columns of the sub-pixels 110 are arranged. For example, the first direction may be the direction X. The following will be described by taking an example where the first direction is the direction X. A distance between two adjacent first transparent conductive lines 341 may be in a range from 1.5 µm to 2.5 µm, such as 1.5 µm, 1.7 µm, 2.0 µm, 2.2 µm or 2.5 µm.

As shown in FIGS. 7 and 8, a first transparent conductive line 341 extends from a first sub-pixel region 342 to the second region AA2 through second sub-pixel region(s) 343. The first sub-pixel region 342 is a sub-pixel region 120 where a starting point of the first transparent conductive line 341 is located, which may be any one of the dummy sub-pixel regions 120B in the first region AA1. The second sub-pixel region 343 is any one of sub-pixel regions 120 through which the first transparent conductive line 341 passes during a process of extending to the second region AA2, which may be a normal sub-pixel region 120A or a dummy sub-pixel region 120B. The number of the sub-pixel regions 120 through which the first transparent conductive line 341 passes may be, for example, 1, 2, 5, 14 or 56. The first transparent conductive line 341 passes through the second sub-pixel region 343, which means that an orthographic projection of a portion of the first transparent conductive line 341 on the substrate 310 is located within an orthogonal projection of the second sub-pixel region 343 on the substrate 310. As for a sub-pixel region 120 through which a transparent conductive line passes in the following embodiments, reference may be made to the above description.

Based on this, the first transparent conductive line 341 may connect a pixel driving circuit 111 in a dummy sub-pixel region 120B in the first region AA1 and a light-emitting device 112 (which may be referred to as a first light-emitting device 112A below) located in the second region AA2. An end of the first transparent conductive line 341 is coupled to a source or a drain of a transistor (which may be, for example, a driving transistor or a switching transistor) included in the pixel driving circuit 111 in the first sub-pixel region 342, and the other end of the first transparent conductive line 341 is coupled to an anode of the first light-emitting device 112A. For example, the first transparent conductive line 341 and the anode of the first light-emitting device 112A may be located in a same conductive layer, and the two may be of a one-piece structure. For another example, the first transparent conductive line 341 and the anode of the first light-emitting device 112A are located in two different conductive layers, and the two may be coupled to each other through a via hole 321 in a dielectric layer located between the two conductive layers.

The second transparent conductive layer 350 is a conductive layer made of a material having a high light transmittance, which improves at least the light transmittance in the second region AA2. For example, the transparent conductive material may include at least one of metal oxides such as ITO and IZO. The material of the second transparent conductive layer 350 and the material of the first transparent conductive layer 340 may be the same or different. As shown in FIG. 9, the second transparent conductive layer 350 is disposed on the side of the metal layer 330 away from the substrate 310, e.g., located above the first transparent conductive layer 340.

With continued reference to FIG. 9, there are a plurality of second transparent conductive lines 351, and the plurality of second transparent conductive lines 351 are arranged in the first direction X and spaced apart from one another. A distance between two adjacent second transparent conductive lines 351 may be in a range from 1.5 µm to 2.5 µm, such as 1.5 µm, 1.8 µm, 2.0 µm, 2.3 µm or 2.5 µm. The distance between the second transparent conductive lines 351 and the distance between the first transparent conductive lines 341 may be the same or different.

Referring to FIG. 7, a second transparent conductive line 351 extends from a third sub-pixel region 352 to the second region AA2 through fourth sub-pixel region(s) 353. The third sub-pixel region 352 is a sub-pixel region 120 where a starting point of the second transparent conductive line 351 is located, which may be any one of the dummy sub-pixel regions 120B in the first region AA1. The fourth sub-pixel region 353 is any one of sub-pixel regions 120 through which the second transparent conductive line 351 passes during a process of extending to the second region AA2. The number of the sub-pixel regions 120 through which the second transparent conductive line 351 passes may be, for example, 1, 7, 13 or 41. The number of the sub-pixel regions 120 through which the second transparent conductive line 351 passes and the number of the sub-pixel regions 120 through which the first transparent conductive line 341 passes may be the same or different. The fourth sub-pixel region 353 may be a normal sub-pixel region 120A or a dummy sub-pixel region 120B.

With continued reference to FIGS. 7 and 8, the second transparent conductive line 351 extends from the third sub-pixel region 352 to the second region AA2 through the fourth sub-pixel region 353, thereby transmitting a signal of a pixel driving circuit 111 to a light-emitting device 112 in the second region AA2. It will be noted that the third sub-pixel region 352 and the first sub-pixel region 342 are different sub-pixel regions 120. For example, the fourth sub-pixel region 353 and the second sub-pixel region 343 may be a same sub-pixel region 120. That is, the first transparent conductive line 341 and the second transparent conductive line 351 each extend from a different sub-pixel region 120 to the second region AA2 through the same sub-pixel region(s) 120 in the first region AA1. Moreover, the number of the same sub-pixel region(s) 120 may be one or more (e.g., 2, 5 or 14).

Based on this, the second transparent conductive line 351 may connect a pixel driving circuit 111 in a dummy sub-pixel region 120B in the first region AA1 and a light-emitting device 112 (which may be referred to as a second light-emitting device 112B below) located in the second region AA2. An end of the second transparent conductive line 351 is coupled to a source or a drain of a transistor (which may be, for example, a driving transistor or a switching transistor) included in the pixel driving circuit 111 in third first sub-pixel region 352, and the other end of the second transparent conductive line 351 is coupled to an anode of the second light-emitting device 112B. For example, the second transparent conductive line 351 and the anode of the second light-emitting device 112B may be located in a same conductive layer, and the two may be of a one-piece structure. For another example, the second transparent conductive line 351 and the anode of the second light-emitting device 112B are located in two different conductive layers, and the two may be coupled to each other through a via hole 321 in a dielectric layer located between the two conductive layers.

As shown in FIGS. 7 to 9, a total overlapping area between an orthographic projection of the first transparent conductive line 341 on the substrate 310 and orthogonal projections, on the substrate 310, of all via holes 321, in the second sub-pixel region 343, of the insulating layer 320 is less than a total overlapping area between an orthographic projection of the second transparent conductive line 351 on the substrate 310 and an orthogonal projection, on the substrate 310, of at least part of via holes 321, in the fourth sub-pixel region 353, of the insulating layer 320.

A total overlapping area is a sum of overlapping areas between an orthographic projection of a transparent conductive line on the substrate 310 and an orthogonal projection of each of all via holes 321 on the substrate 310. In this way, there are at least two factors that affect the total overlapping area, one of which is the number of via holes through which the transparent conductive line passes, and the other of which is an overlapping area between the orthographic projection of the transparent conductive line on the substrate 310 and an orthogonal projection of a single via hole 321 on the substrate 310 (which may be also referred to as an overlapping degree between the transparent conductive line and a single via hole 321).

In this case, there are a plurality of implementations. In some embodiments, as shown in FIGS. 7 to 9, the orthographic projection of the first transparent conductive line 341 on the substrate 310 is non-overlapping with the orthogonal projections, on the substrate 310, of all the via holes 321, in the second sub-pixel region 343, of the insulating layer 320. For convenience of description, the orthographic projection of the first transparent conductive line 341 on the substrate 310 is referred to as a first orthographic projection. The first orthographic projection is non-overlapping with an orthogonal projection, on the substrate 310, of a certain via hole 321 in the second sub-pixel region 343, which may mean that the first transparent conductive line 341 does not pass above the via hole 321. As an example, the first orthographic projection is non-overlapping with an orthogonal projection, on the substrate 310, of each via hole 321, in each sub-pixel region 120 through which the first transparent conductive line 341 passes, of the insulating layer 320. That is, the first transparent conductive line 341 does not pass above any via hole 321, in all the sub-pixel regions 120 through which the first transparent conductive line 341 passes, of the insulating layer 320.

That is, the total overlapping area between the orthographic projection of the first transparent conductive line 341 on the substrate 310 and the orthogonal projections, on the substrate 310, of all the via holes 321, in the second sub-pixel region 343, of the insulating layer 320 is equal to zero.

With continued reference to FIGS. 8 and 9, the orthographic projection of the second transparent conductive line 351 on the substrate 310 overlaps with the orthogonal projection, on the substrate 310, of the at least part of all via holes 321, in the fourth sub-pixel region 353, of the insulating layer 320. For convenience of description, the orthographic projection of the second transparent conductive line 351 on the substrate 310 is referred to as a second orthographic projection. The second orthographic projection of the second transparent conductive line 351 is non-overlapping with an orthogonal projection, on the substrate 310, of a certain via hole 321 in the second sub-pixel region 343, which may mean that the second transparent conductive line 351 does not pass above the via hole 321. As an example, the second orthographic projection of the second transparent conductive line 351 overlaps with an orthogonal projection, on the substrate 310, of at least part of via holes 321 in any sub-pixel region 120 through which the second transparent conductive line 351 passes. That is, the second transparent conductive line 351 passes above a part or all the via holes 321 in each sub-pixel region 120 through which the second transparent conductive line 351 passes.

Thus, the total overlapping area between the orthographic projection of the first transparent conductive line 341 on the substrate 310 and the orthogonal projections, on the substrate 310, of all the via holes 321, in the second sub-pixel region 343, of the insulating layer 320 is less than the total overlapping area between the orthographic projection of the second transparent conductive line 351 on the substrate 310 and the orthogonal projection, on the substrate 310, of the at least part of the via holes 321, in the fourth sub-pixel region 353, of the insulating layer 320.

It is found by the inventors of the present disclosure that there are a large number of transparent conductive lines (which include, for example, the plurality of first transparent conductive lines 341 and the plurality of second transparent conductive lines 351) arranged in the first region AA. In order to arrange the transparent conductive lines in a limited region, the transparent conductive lines are distributed densely, so that a part of the transparent conductive lines (e.g., the first transparent conductive line 341 or the second transparent conductive line 351) need to pass above some via holes 321 of the insulating layer 320. In a case where an inner wall of a via hole through which the transparent conductive line passes is covered by the metal layer 330, the transparent conductive line passes through a structure 331 similar to a concave mirror.

Figure 10A:
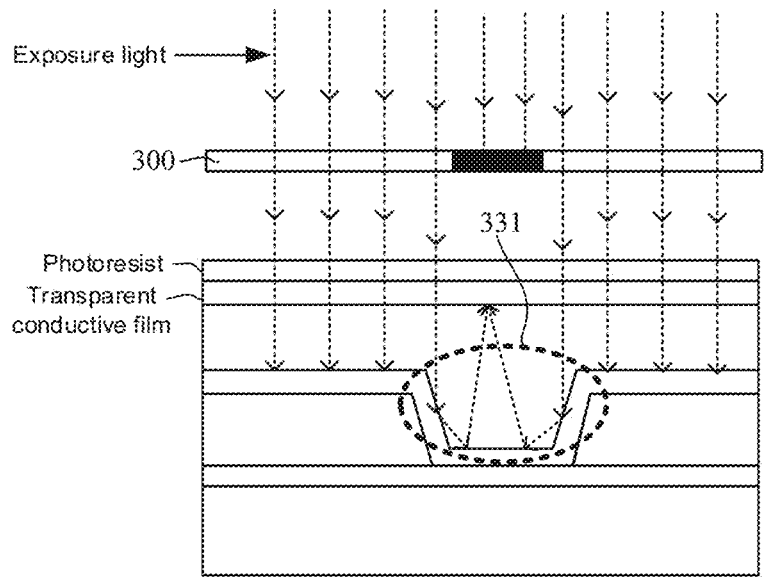
FIG. 10A is a diagram showing a light path of exposure at a structure similar to a concave mirror, in accordance with some examples.
Figure 10B:
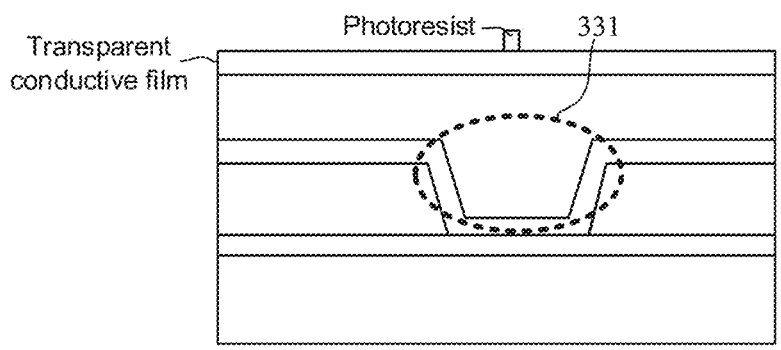
FIG. 10B is a schematic diagram of a photoresist after exposure at a structure similar to a concave mirror, in accordance with some examples.
Figure 10C:
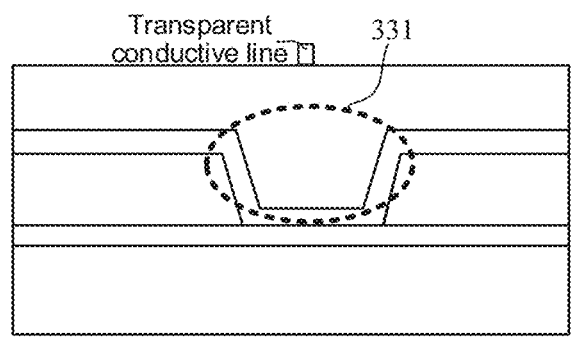
FIG. 10C is a schematic diagram of a transparent conductive line after exposure at a structure similar to a concave mirror, in accordance with some examples.

FIG. 10A is a schematic diagram showing a light path of exposure at a structure 331 similar to a concave mirror. FIG. 10B is a schematic diagram of a photoresist after exposure at the structure 331 similar to the concave mirror. FIG. 10C is a schematic diagram of a transparent conductive line after exposure at the structure 331 similar to the concave mirror.

A method of manufacturing a transparent conductive line may include the following steps. Firstly, referring to FIG. 10A, a transparent conductive material is deposited by a process such as sputtering or chemical vapor deposition (CVD), so as to form a transparent conductive film, After that, the transparent conductive film may be coated with a positive photoresist, and exposure may be performed on the positive photoresist by using a mask 300. Then, referring to FIG. 10B, development is performed on the exposed positive photoresist, so as to form a photoresist pattern. Next, referring to FIG. 10C, a portion not covered by the photoresist pattern is removed. For example, the transparent conductive film may be etched by using an etching solution. A portion of the transparent conductive film covered by the photoresist pattern is remained, and the rest is removed, so as to form the transparent conductive line.

However, during the process, shown in FIG. 10A, of performing the exposure on the positive photoresist, in a case where a via hole 321 through which a designed transparent conductive line passes is covered by the metal layer 330, the metal layer 330 forms a structure 331 similar to a concave mirror, the structure 331 similar to the concave mirror gathers light, and the gathered light is cast upon the positive photoresist through the transparent conductive film, which results in overexposure on the positive photoresist above the via hole 321. Thus, a width reduction or even cracking is prone to occur at a position of the photoresist pattern corresponding to the via hole 321, which results in an undesirable problem, such as a width reduction or even cracking, of the respective formed transparent conductive line, so that a display effect of a light-transmitting display portion is relatively poor.

The light gathered by the structure 331 similar to the concave mirror of the metal layer 330 is gradually gathered. Therefore, in a direction, i.e., a third direction Z (as shown in FIG. 9), perpendicular to the substrate 310, if a distance between the positive photoresist and the structure 331 similar to the concave mirror is relatively small, the light is relatively compact and has a relatively large light intensity, and in this case, a degree of the overexposure on the positive photoresist is relatively large; on the contrary, if the distance between the positive photoresist and the structure 331 similar to the concave mirror is relatively large, the light is relatively sparse and has a relatively small light intensity, and in this case, the degree of the overexposure on the positive photoresist is relatively small.

With continued reference to FIG. 9, in the direction Z perpendicular to the substrate 310, a distance between the second transparent conductive layer 350 and the metal layer 330 is greater than a distance between the first transparent conductive layer 340 and the metal layer 330. Moreover, the first transparent conductive line 341 avoids above the via hole 321 of the insulating layer 320, and the second transparent conductive line 351 passes above the via hole 321 of the insulating layer 320. In this way, the function of gathering light by the structure 331 similar to the concave mirror has no or little influence on forming the first transparent conductive line 341. The distance between the second transparent conductive layer 350 and the metal layer 330 is relatively large. Thus, during a process of forming the second transparent conductive layer 350, a degree of overexposure, due to the structure 331 similar to the concave mirror, on a respective positive photoresist is relatively small, so that a portion, corresponding to the via hole 321, of the second transparent conductive line 351 is not prone to be narrowed or crack. As a result, a display effect in the second region AA2 is improved.

In some other possible embodiments, the orthographic projection of the first transparent conductive line 341 on the substrate 310 may overlap with an orthogonal projection, on the substrate 310, of at least part of the via holes 321, in the second sub-pixel region 343, of the insulating layer 320, and a total overlapping area therebetween is less than the total overlapping area between the orthographic projection of the second transparent conductive line 351 on the substrate 310 and the orthogonal projection, on the substrate 310, of the at least part of the via holes 321, in the fourth sub-pixel region 353, of the insulating layer 320.

The above situation may include various implementations. For example, an overlapping degree between the first transparent conductive line 341 and a single via hole 321 is equal to an overlapping degree between the second transparent conductive line 351 and a single via hole 321. The number (e.g., 1) of via holes 321 through which the first transparent conductive line 341 passes in the second sub-pixel region 343 is less than the number (e.g., 3) of via holes 321 through which the second transparent conductive line 351 passes in the fourth sub-pixel region 353.

For another example, the number (e.g., 2) of via holes 321 through which the first transparent conductive line 341 passes in the second sub-pixel region 343 is equal to the number (e.g., 2) of via holes 321 through which the second transparent conductive line 351 passes in the fourth sub-pixel region 353, but an overlapping degree between the first transparent conductive line 341 and a single via hole 321 is less than an overlapping degree between the second transparent conductive line 351 and a single via hole 321. Only a small portion of the first transparent conductive line 341 passes through the via hole 321, and most of the second transparent conductive line 351 passes through the via hole 321.

For yet another example, an overlapping degree between the first transparent conductive line 341 and a single via hole 321 is less than an overlapping degree between the second transparent conductive line 351 and a single via hole 321, and moreover, the number of via holes 321 through which the first transparent conductive line 341 passes in the second sub-pixel region 343 is less than the number of via holes 321 through which the second transparent conductive line 351 passes in the fourth sub-pixel region 353.

Figure 11:
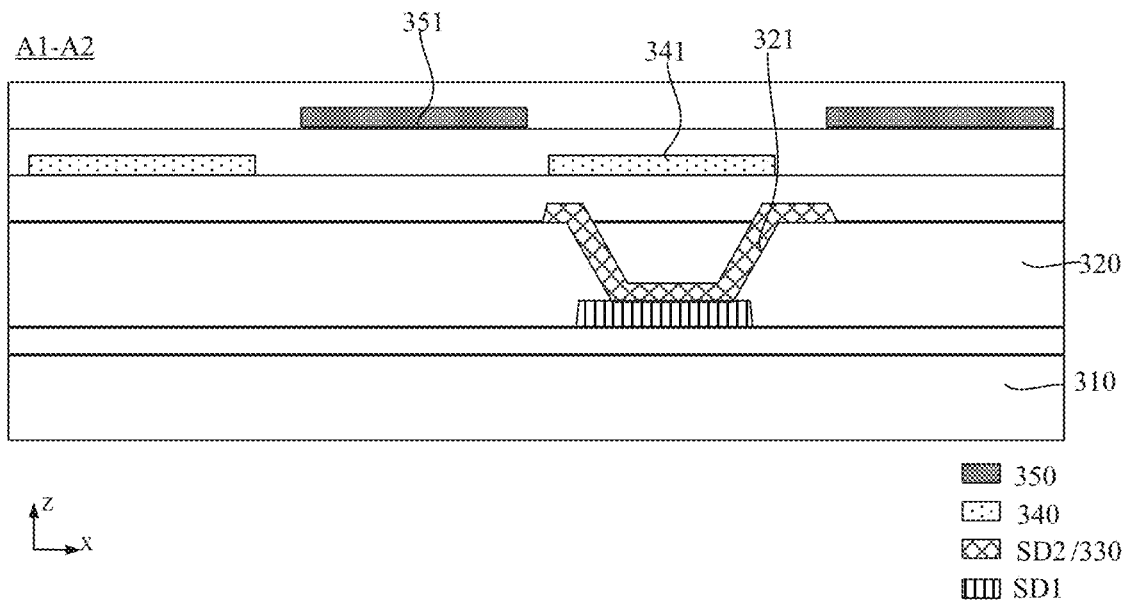
FIG. 11 is another sectional view of the display panel shown in FIG. 8 taken along the line A1-A2.

FIG. 11 is another sectional view of the display panel shown in FIG. 7.

In yet other embodiments, referring to FIG. 11, the total overlapping area between the orthographic projection of the first transparent conductive line 341 on the substrate 310 and the orthogonal projections, on the substrate 310, of all the via holes 321, in the second sub-pixel region 343, of the insulating layer 320 is greater than the total overlapping area between the orthographic projection of the second transparent conductive line 351 on the substrate 310 and the orthogonal projection, on the substrate 310, of the at least part of the via holes 321, in the fourth sub-pixel region 353, of the insulating layer 320. For example, the first transparent conductive line 341 of the first transparent conductive layer 340 passes above some via holes 321 of the insulating layer 320, and the second transparent conductive line 351 does not pass above the some via holes 321.

In some embodiments, with continued reference to FIGS. 8 and 9, the orthogonal projection, on the substrate 310, of the at least part (one or more) of the via holes 321, in the fourth sub-pixel regions 353, of the insulating layer 320 is located within the orthographic projection of the second transparent conductive line 351 on the substrate 310. That is, in a width direction (e.g., the first direction X) of the second transparent conductive line 351, a dimension W1 of an upper opening 321*a* of a via hole 321 is less than or equal to a width W2 of a portion, passing above the via hole 321, of the second transparent conductive line 351. In this case, during the process of manufacturing the second transparent conductive line 351, the mask 300 may theoretically cover a region above the entire via hole 321, so that the light will not be cast upon the metal layer 330 covering an inner wall of the opening. As a result, a risk of the overexposure on the positive photoresist is further reduced, so that the second transparent conductive line 351 is not prone to crack.

Furthermore, the orthogonal projection, on the substrate 310, of the at least part of the via holes 321, in the fourth sub-pixel region 353, of the insulating layer 320 is enclosed by the orthographic projection of the second transparent conductive line 351 on the substrate 310. In this case, the dimension W1 is less than the dimension W2. That is, the second transparent conductive line 351 has a certain width design margin. In this way, even if there is the certain risk, caused by a fact that the light is cast upon the structure 331 similar to the concave mirror at the via hole 321 for a certain reason (e.g., diffraction), of the overexposure during the process of the exposure, the width design margin of the second transparent conductive line 351 may reduce the risk of the overexposure to a certain extent, which makes the photoresist pattern not prone to be damaged, thereby further making the second transparent conductive line 351 not prone to crack.

Figure 12:
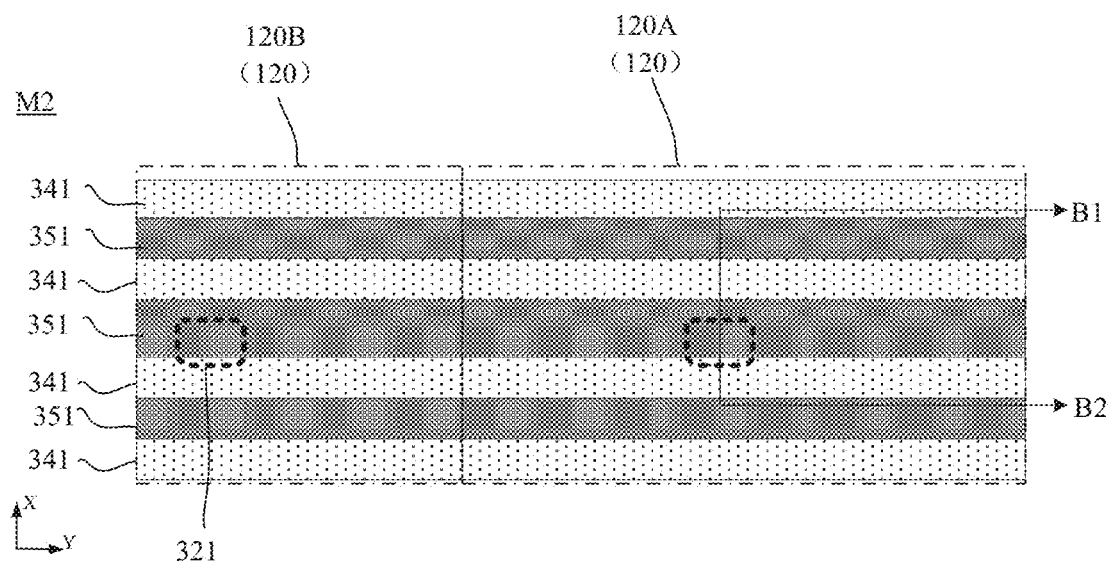
FIG. 12 is another enlargement view of the region M2 in FIG. 7.
Figure 13:
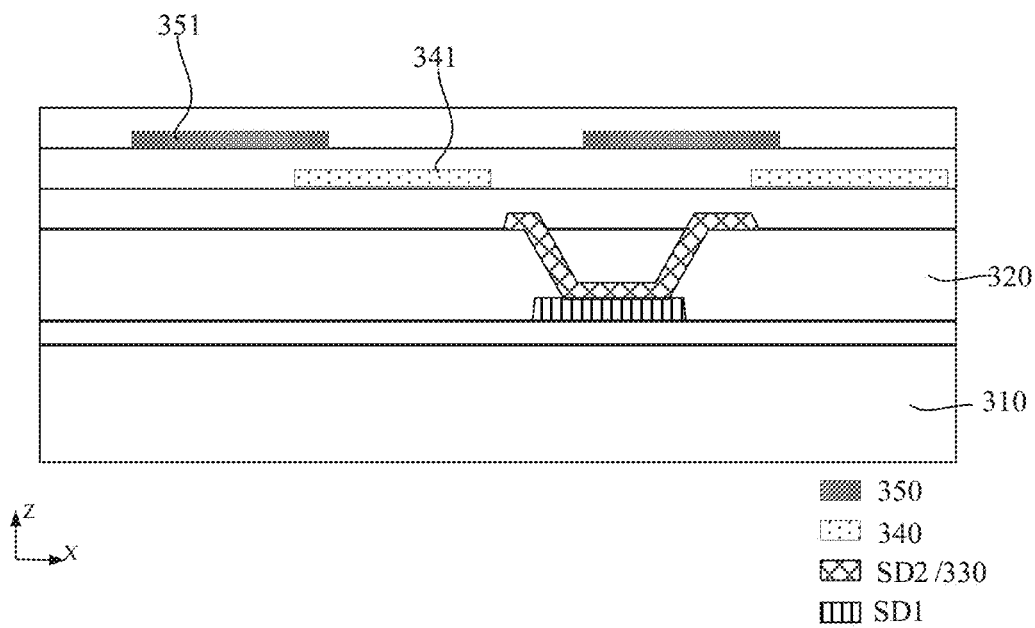
FIG. 13 is a sectional view of the display panel shown in FIG. 12 taken along the line B1-B2.

FIG. 12 is another enlargement view of the region M2 in FIG. 7. FIG. 13 is a sectional view of the display panel shown in FIG. 12 taken along the line B1-B2.

In some other embodiments, referring to FIGS. 12 and 13, an orthogonal projection, on the substrate 310, of a via hole 321, in the fourth sub-pixel region 353, of the insulating layer 320 may partially overlap with the orthographic projection of the second transparent conductive line 351 on the substrate 310.

In this case, during the process of manufacturing the second transparent conductive line 351, the mask 300 may theoretically cover a side region (e.g., a right side region in FIG. 13) above the via hole 321, so that the light will not be cast upon the metal layer 330 covering an inner wall of a right side of the opening. As a result, a risk of overexposure on a right side of the positive photoresist is further reduced, so that the second transparent conductive line 351 is not prone to crack.

In some embodiments, with continued reference to FIG. 8, a maximum width W3 of the second transparent conductive line 351 in the fourth sub-pixel region 353 is greater than a width W4 of the first transparent conductive line 341 in the second sub-pixel region 343.

A width of a portion, in the fourth sub-pixel region 353, of the second transparent conductive line 351 may vary. In this case, the maximum width of the second transparent conductive line 351 in the fourth sub-pixel region 353 is a maximum value of widths of portions, at different positions in the fourth sub-pixel region 353, of the second transparent conductive line 351. A portion, in the fourth sub-pixel region 353, of the second transparent conductive line 351 has an equal width at every position. In this case, the maximum width of the second transparent conductive line 351 in the fourth sub-pixel region 353 is a width of the second transparent conductive line 351 in the fourth sub-pixel region 353. A width of a portion, at a position corresponding to the via hole 321, of the second transparent conductive line 351 may be narrowed due to an influence of the via hole 321, so that the maximum width of the second transparent conductive line 351 in the fourth sub-pixel region 353 may be measured at a position never passing above the via hole 321. The width W3 is greater than the width W4. In this case, the second transparent conductive line 351 also has a certain width design margin. Thus, it is possible to reduce a risk that the second transparent conductive line 351 cracks above the via hole 321.

Figure 14:
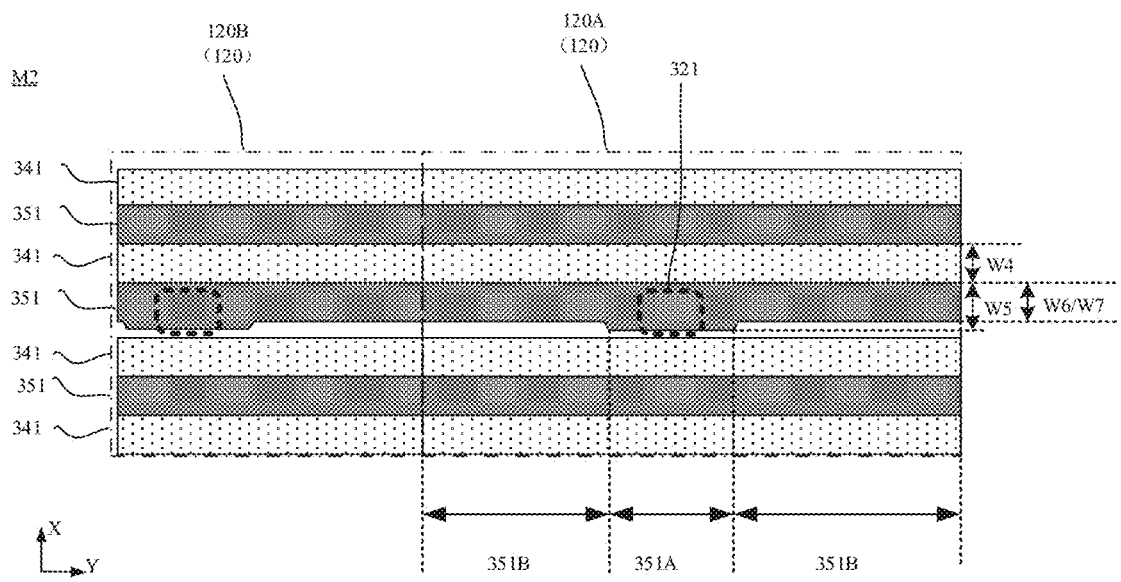
FIG. 14 is yet another enlargement view of the region M2 in FIG. 7.

FIG. 14 is yet another enlargement view of the region M2 in FIG. 7.

In some embodiments, referring to FIG. 14, the portion of the second transparent conductive line 351 in the fourth sub-pixel region 353 includes a first section 351A and second sections 351B that are distributed in a second direction and connected to one another. The second direction is an extending direction of the second transparent conductive line 351. The second transparent conductive line 351 may extend in the direction Y For convenience of description, the following will be described by taking an example where the second direction is the direction Y.

With continued reference to FIG. 14, an orthographic projection of the first section 351A on the substrate 310 overlaps with an orthogonal projection, on the substrate 310, of at least part of the via holes 321, in the fourth sub-pixel region 353, of the insulating layer 320. That is, the first section 351A is a portion, passing through the at least part of the via holes 321, of the second transparent conductive line 351. Orthographic projections of the second sections 351B on the substrate 310 are non-overlapping with the orthogonal projections, on the substrate 310, of all the via holes 321, in the fourth sub-pixel region 353, of the insulating layer 320. The second sections 351B are each a portion, not passing through the via hole(s) 321, of the second transparent conductive line 351. A maximum width W5 of the first section 351A is a maximum width of the portion, passing through the at least part of the via holes 321, of the second transparent conductive line 351 in the fourth sub-pixel region 353.

For example, referring to FIG. 14, the maximum width W5 of the first section 351A is greater than a width W6 of the second section 351B. In this case, during the process of manufacturing the second transparent conductive line 351, the mask 300 may theoretically cover a relatively large region above the via hole 321, so that the light cast upon the metal layer 330 covering the inner wall of the opening is reduced. As a result, the risk of the overexposure on the positive photoresist is further reduced, so that the second transparent conductive line 351 is not prone to crack.

In some other examples, the first section 351A has an equal width at every position, and thus the maximum width W5 of the first section 351A is equal to the width W6 of the second section 351B. In this way, the width of the second transparent conductive line 351 in the fourth sub-pixel region 353 is relatively uniform, and thus a width of each portion, corresponding to a respective opening, of the mask 300 used for manufacturing the second transparent conductive line 351 is uniform. As a result, a difficulty in processing the mask 300 and a requirement for an accuracy of the processing are both reduced.

In some embodiments, with continued reference to FIG. 14, the maximum width W5 of the first section 351A is greater than the width W4 of the first transparent conductive line 341 in the second sub-pixel region 343; and/or a maximum width W7 of a second section 351B is equal to the width W4 of the first transparent conductive line 341 in the second sub-pixel region 343.

With continued reference to FIG. 14, the first section 351A passes above the respective via hole 321, and thus there is a need to provide a certain width design margin for the first section 351A. The first transparent conductive line 341 avoids the via hole 321 in the second sub-pixel region 343, and thus there is no need to provide a width design margin for the width W4 of the first transparent conductive line 341 in the second sub-pixel region 343. Therefore, the maximum width W5 of the first section 351A is greater than the width W4 of the first transparent conductive line 341 in the second sub-pixel region 343, In this case, in the first region AA1, a distribution of the first transparent conductive lines 341 and the second transparent conductive lines 351 is reasonable. In a case where a space of the first region AA1 is constant, the width W4 of the first transparent conductive line 341 in the second sub-pixel region 343 is relatively small, so that a relatively large space is allocated for arranging the first section 351A of the second transparent conductive line 351. In this way, it is possible to not only ensure that the first transparent conductive lines 341 and the first sections 351A each have a sufficient distribution space, but also ensure that an arrangement density, in the first region AA1, of the first transparent conductive lines 341 and the second transparent conductive lines 351 is relatively small.

The second section 351B avoids the via hole 321, and thus there is no need to provide a certain width design margin for the second section 351B. Therefore, the maximum width W7 of the second section 351B may be equal to the width W4 of the first transparent conductive line 341 in the second sub-pixel region 343. In this way, the arrangement density, in the first region AA1, of the first transparent conductive lines 341 and the second transparent conductive lines 351 is relatively small.

In some embodiments, referring to FIGS. 8 and 9, an orthographic projection of a first transparent conductive line 341 on the substrate 310 is non-overlapping with orthographic projections of multiple second transparent conductive lines 351 on the substrate 310. For example, an orthographic projection of any first transparent conductive line 341 on the substrate 310 may be non-overlapping with orthographic projections of all the second transparent conductive lines 351 on the substrate 310. In this way, the first transparent conductive line 341 is non-overlapping, in the first direction X, with all the second transparent conductive lines 351, so that a capacitance between the first transparent conductive line 341 and a second transparent conductive line 351 adjacent thereto is relatively small.

In some embodiments, with continued reference to FIGS. 8 and 9, the plurality of first transparent conductive lines 341 and the plurality of second transparent conductive lines 351 are alternately arranged in the first direction X. In this case, except for first transparent conductive lines 341 located on two sides in the first direction X, an orthographic projection, on the substrate 310, of any first transparent conductive line 341 is located between orthographic projections, on the substrate 310, of two second transparent conductive lines 351 adjacent to the any first transparent conductive line 341. Similarly, except for second transparent conductive lines 351 located on the two sides in the first direction X, an orthographic projection, on the substrate 310, of a second transparent conductive line 351 is located between orthographic projections of two first transparent conductive lines 341 on the substrate 310, In this way, a gap is remained between every two adjacent transparent conductive lines in a same transparent conductive layer (the first transparent conductive layer 340 or the second transparent conductive layer 350), which ameliorates a problem of possible short circuit between two adjacent transparent conductive lines in the related art while supporting high-density wiring (the arrangement of the transparent conductive lines).

In some embodiments, a distance H, in the direction perpendicular to the substrate 310, between the second transparent conductive line 351 and the insulating layer 320 is greater than or equal to 4.5 μm.

With continued reference to FIG. 9, the direction perpendicular to the substrate 310 is the direction Z. For convenience of description, the direction perpendicular to the substrate 310 is defined as the third direction Z below. If a distance between the second transparent conductive line 351 and the structure 331 similar to the concave mirror is relatively large, the light is relatively sparse, and thus the influence of the structure 331 similar to the concave mirror on the width of the second transparent conductive line 351 is relatively small. In a case where the distance H, in the third direction Z, between the second transparent conductive line 351 and the insulating layer 320 (i.e., between the second transparent conductive line 351 and the upper opening 321a of the via hole 321) is greater than or equal to 4.5 μm, such as 4.5 μm, 4.7 μm, 5.0 μm, 5.5 μm or 7.4 μm, the influence of the structure 331 similar to the concave mirror on the width of the second transparent conductive line 351 is relatively small. Thus, a probability that the width of the second transparent conductive line 351 is decreased or a degree to which the width of the second transparent conductive line 351 is decreased is reduced.

Figure 15:
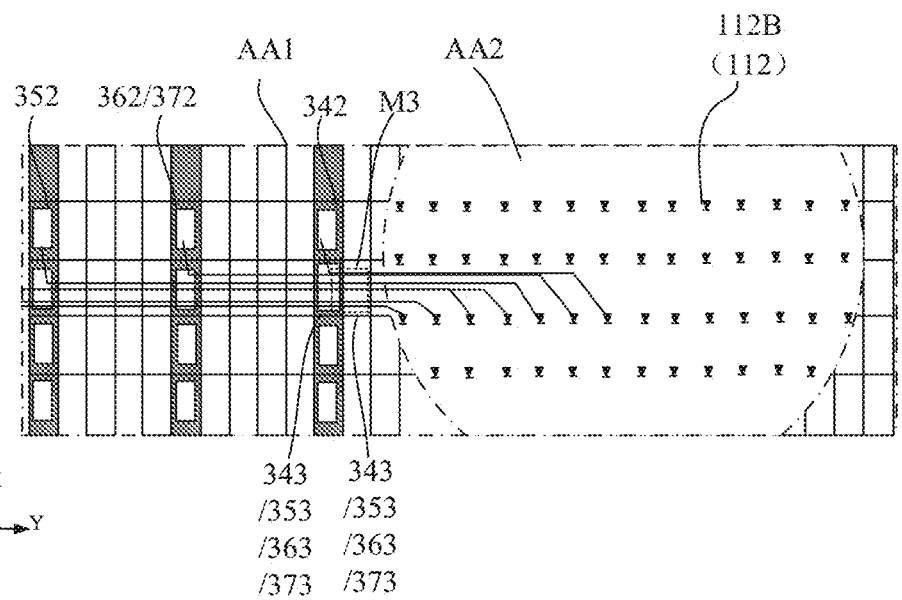
FIG. 15 is a partial top view of another display panel, in accordance with some other embodiments.
Figure 16:
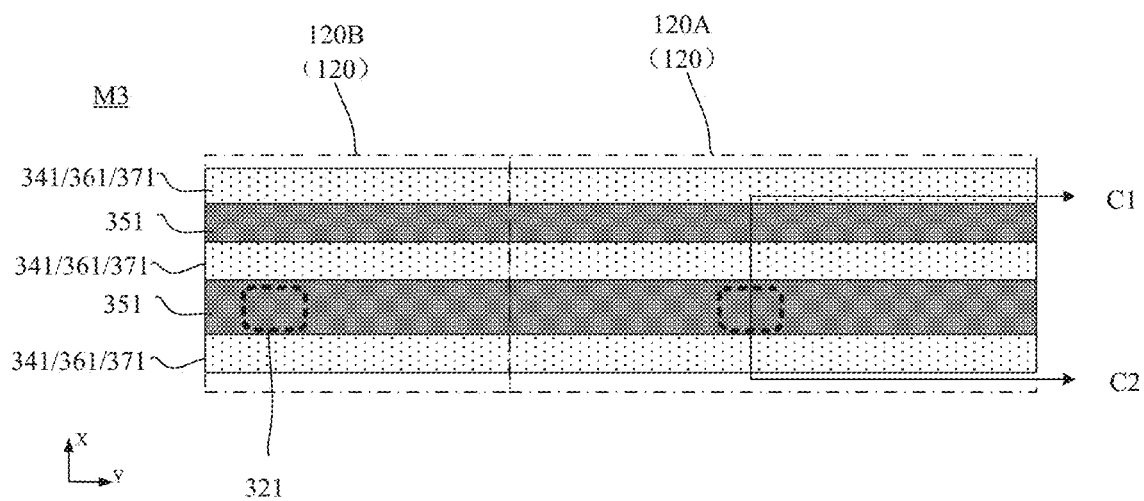
FIG. 16 is an enlargement view of the region M3 in FIG. 15.
Figure 17:
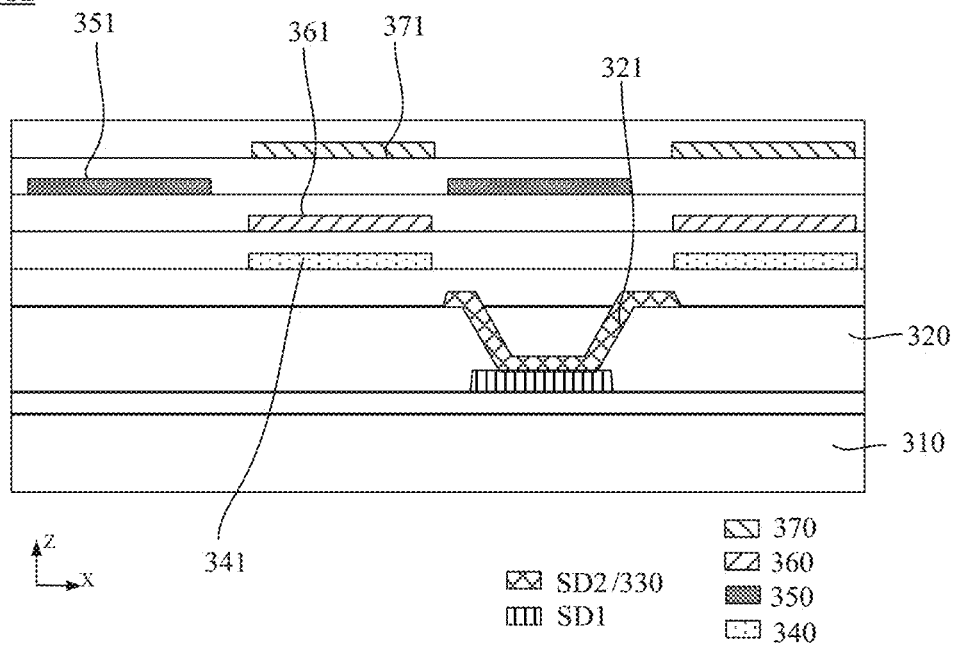
FIG. 17 is a sectional view of the display panel shown in FIG. 16 taken along the line C1-C2.

FIG. 15 is a partial top view of another display panel. FIG. 16 is an enlargement view of the region M3 in FIG. 15. FIG. 17 is a sectional view of the display panel shown in FIG. 16 taken along the line C1-C2.

In some embodiments, referring to FIGS. 15 to 17, the display panel 100 further includes a third transparent conductive layer 360. In a case where the first transparent conductive layer 340 and the second transparent conductive layer 350 cannot satisfy a requirement for wiring (for example, the number of transparent conductive lines needing to pass through a certain sub-pixel region 120 is relatively large, and the first transparent conductive layer 340 and the second transparent conductive layer 350 in the sub-pixel region 120 do not have an enough space for arranging all of the transparent conductive lines), the display panel 100 may be provided with the third transparent conductive layer 360.

The third transparent conductive layer 360 is a conductive layer made of a material having a high light transmittance, which improves at least the light transmittance in the second region AA2. For example, the transparent conductive material may include at least one of metal oxides such as ITO and IZO. The materials of the first transparent conductive layer 340, the second transparent conductive layer 350 and the third transparent conductive layer 360 may be partially the same, all the same or completely different.

Referring to FIG. 16, there are a plurality of third transparent conductive lines 361, and the plurality of third transparent conductive lines 361 are arranged in the first direction X and spaced apart from one another. A distance between two adjacent third transparent conductive lines 361 may be in a range from 1.5 μm to 2.5 μm, such as 1.5 μm, 1.9 μm, 2.0 μm, 2.4 μm or 2.5 μm. The distance between the third transparent conductive lines 361 and the distance between the first transparent conductive lines 341 may be the same or different.

With continued reference to FIGS. 15 and 16, a third transparent conductive line 361 extends from a fifth sub-pixel region 362 to the second region AA2 through a sixth sub-pixel region 363. The fifth sub-pixel region is a sub-pixel region 120 where a starting point of the third transparent conductive line 361 is located, which may be any one of the dummy sub-pixel regions 120B in the first region AA1. The sixth sub-pixel region 363 is any one of sub-pixel regions 120 through which the third transparent conductive line 361 passes during a process of extending to the second region AA2. The number of the sub-pixel regions 120 through which the third transparent conductive line 361 passes may be, for example, 1, 9, 17 or 62. The number of the sub-pixel regions 120 through which the third transparent conductive line 361 passes and the number of the sub-pixel regions 120 through which the first transparent conductive line 341 passes may be the same or different. The sixth sub-pixel region 363 may be a normal sub-pixel region 120A or a dummy sub-pixel region 120B.

With continued reference to FIGS. 15 and 16, the third transparent conductive line 361 extends from the fifth sub-pixel region to the second region AA2 through the sixth sub-pixel region 363, thereby transmitting a signal of a pixel driving circuit 111 to a light-emitting device 112 in the second region AA2. It will be noted that the fifth sub-pixel region and the first sub-pixel region 342 are different sub-pixel regions 120. For example, the second sub-pixel region 343, the fourth sub-pixel region 353 and the sixth sub-pixel region 363 may be different sub-pixel regions 120. Alternatively, a part of the second sub-pixel region 343, the fourth sub-pixel region 353 and the sixth sub-pixel region 363 may be a same sub-pixel region 120. Alternatively, all of the second sub-pixel region 343, the fourth sub-pixel region 353 and the sixth sub-pixel region 363 may be a same sub-pixel region 120.

Based on this, the third transparent conductive line 361 may connect a pixel driving circuit 111 in a dummy sub-pixel region 120B in the first region AA1 and a light-emitting device 112 located in the second region AA2. As for connection manners of two ends of the third transparent conductive line 361, reference may be made to the first transparent conductive line 341 and the second transparent conductive line 351, which will not be repeated here.

Referring to FIGS. 16 and 17, an orthographic projection of the third transparent conductive line 361 on the substrate 310 is non-overlapping with orthogonal projections, on the substrate 310, of all via holes 321, in the sixth sub-pixel region 363, of the insulating layer 320. For convenience of description, the orthographic projection of the third transparent conductive line 361 on the substrate 310 is referred to as a third orthographic projection. The third orthographic projection is non-overlapping with an orthogonal projection, on the substrate 310, of a certain via hole 321 in the sixth sub-pixel region 363, which may mean that the third transparent conductive line 361 does not pass above the via hole 321. With continued reference to FIG. 17, as an example, the third orthographic projection is non-overlapping with an orthogonal projection, on the substrate 310, of each via hole 321, in each sub-pixel region 120 through which the third transparent conductive line 361 passes, of the insulating layer 320. That is, the third transparent conductive line 361 does not pass above any via hole 321, in all the sub-pixel regions 120 through which the third transparent conductive line 361 passes, of the insulating layer 320. In this way, it is possible to reduce or avoid the influence, on the third transparent conductive line 361, of the function of gathering light by the structure 331 similar to the concave mirror, so that a width of the third transparent conductive line 361 is uniform. As a result, the display effect in the second region AA2 is ensured.

In some embodiments, with continued reference to FIG. 17, the orthographic projection of the first transparent conductive line 341 on the substrate 310 partially overlaps with orthographic projections of the plurality of third transparent conductive lines 361 on the substrate 310. The first orthographic projection partially or completely overlaps with the third orthographic projection. In a case where the first orthographic projection completely overlaps with the third orthographic projection, the width of the third transparent conductive line 361 is equal to the width of the first transparent conductive line 341, and the third transparent conductive line 361 is located directly above the first transparent conductive line 341.

Whether the first orthographic projection and the third orthographic projection overlap with each other partially or completely, a total area occupied by both the first orthographic projection and the third orthographic projection on the substrate 310 is relatively small. In this way, the wiring space of the second transparent conductive lines 351 is relatively large, so that the wiring is relatively flexible. The second transparent conductive line 351 not only passes above the via hole 321, but also avoids overlapping with any one of the first transparent conductive line 341 and the third transparent conductive line 361 in the first direction X or reduces an overlapping area therebetween. That is, the second orthographic projection does not overlap either the first orthographic projection or the third orthographic projection as much as possible. Alternatively, an overlapping area between the second orthographic projection and any one of the first orthographic projection and the third orthographic projection is reduced. In this way, it is possible to reduce a capacitance between the second transparent conductive line 351 and any one of the first transparent conductive line 341 and the third transparent conductive line 361.

In some embodiments, with continued reference to FIG. 17, the sixth sub-pixel region 363 and the second sub-pixel region 343 are a same sub-pixel region 120. In the second sub-pixel region 343, the orthographic projection of the third transparent conductive line 361 on the substrate 310 overlaps with the orthographic projection of the first transparent conductive line 341 on the substrate 310.

In a case where the sixth sub-pixel region 363 and the second sub-pixel region 343 are a same sub-pixel region 120, the first transparent conductive line 341 and the third transparent conductive line 361 pass through the same sub-pixel region 120. In the same sub-pixel region 120, the first orthographic projection partially or completely overlaps with the third orthographic projection. In the case where the first orthographic projection completely overlaps with the third orthographic projection, the width of the third transparent conductive line 361 in the same sub-pixel region 120 is equal to the width of the first transparent conductive line 341 in the same sub-pixel region 120, and the third transparent conductive line 361 is located directly above the first transparent conductive line 341.

In the same sub-pixel region 120, whether the first orthographic projection and the third orthographic projection overlap with each other partially or completely, the total area occupied by both the first orthographic projection and the third orthographic projection on the substrate 310 is relatively small. In this way, the wiring space of the second transparent conductive lines 351 in the same sub-pixel region 120 is relatively large, so that the wiring is relatively flexible. The second transparent conductive line 351 not only passes above the via hole 321, but also avoids overlapping with any one of the first transparent conductive line 341 and the third transparent conductive line 361 in the first direction X or reduces the overlapping area therebetween. That is, the second orthographic projection does not overlap either the first orthographic projection or the third orthographic projection as much as possible. Alternatively, the overlapping area between the second orthographic projection and any one of the first orthographic projection and the third orthographic projection is reduced. In this way, it is possible to reduce the capacitance between the second transparent conductive line 351 and any one of the first transparent conductive line 341 and the third transparent conductive line 361 in the same sub-pixel region 120.

It will be noted that the width of the third transparent conductive line 361 may be greater than, equal to or less than the width of the first transparent conductive line 341 in the same sub-pixel region, which is not limited herein. In the same sub-pixel region, the width of the third transparent conductive line 361 may be equal to or less than the width of the second transparent conductive line 351, which is not limited herein, A positional relationship between the third transparent conductive line 361 and the second transparent conductive line 351 may be set with reference to a positional relationship between the first transparent conductive line 341 and the second transparent conductive line 351. For example, the orthographic projection of the third transparent conductive line 361 on the substrate 310 is non-overlapping with the orthographic projections of all of the second transparent conductive lines 351 on the substrate 310; alternatively, the orthographic projection of the third transparent conductive line 361 on the substrate 310 overlaps with an orthographic projection of at least part (e.g., all or a part) of the second transparent conductive lines 351 on the substrate 310.

Figure 18:
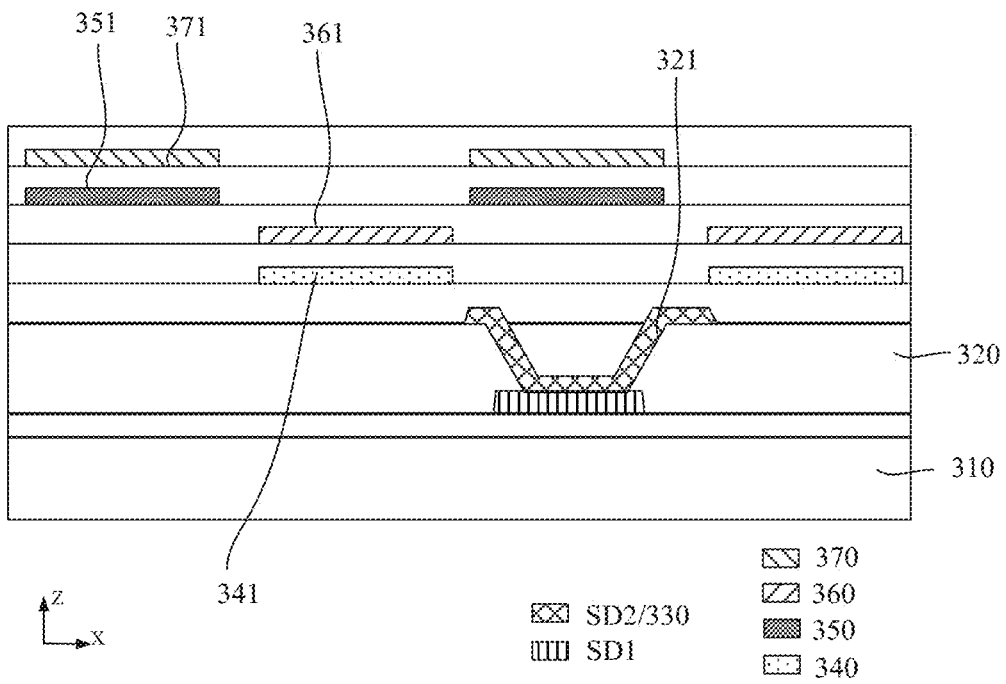
FIG. 18 is another sectional view of the display panel shown in FIG. 16 taken along the line C1-C2.

FIG. 18 is another sectional view of the display panel shown in FIG. 15.

Referring to FIGS. 17 and 18, in some embodiments, in the case where the first transparent conductive layer 340 and the second transparent conductive layer 350 cannot satisfy the requirement for wiring, the display panel 100 further includes a fourth transparent conductive layer 370. The fourth transparent conductive layer 370 is a conductive layer made of a material having a high light transmittance, which improves at least the light transmittance in the second region AA2. For example, the transparent conductive material may include at least one of metal oxides such as ITO and IZO. The materials of the first transparent conductive layer 340, the second transparent conductive layer 350, the third transparent conductive layer 360 and the fourth transparent conductive layer 370 may be partially the same, all the same or completely different.

There are a plurality of fourth transparent conductive lines 371, and the plurality of fourth transparent conductive lines 371 are arranged in the first direction X and spaced apart from one another. A distance between two adjacent fourth transparent conductive lines 371 may be in a range from 1.5 µm to 2.5 µm, such as 1.5 µm, 1.6 µm, 2.0 µm, 2.4 µm or 2.5 µm. The distance between the first transparent conductive lines 341, the distance between the second transparent conductive lines 351, the distance between the third transparent conductive lines 361 and the distance between the fourth transparent conductive lines 371 may be partially the same, all the same or completely different.

As shown in FIGS. 15 and 16, a fourth transparent conductive line 371 extends from a seventh sub-pixel region 372 to the second region AA2 through an eighth sub-pixel region 373. The seventh sub-pixel region 372 is a sub-pixel region 120 where a starting point of the fourth transparent conductive line 371 is located, which may be any one of the dummy sub-pixel regions 120B in the first region AA1, The eighth sub-pixel region 373 is any one of sub-pixel regions 120 through which the fourth transparent conductive line 371 passes during a process of extending to the second region AA2. The number of the sub-pixel regions 120 through which the fourth transparent conductive line 371 passes may be, for example, 1, 11, 32 or 68. The number of the sub-pixel regions 120 through which the fourth transparent conductive line 371 passes and the number of the sub-pixel regions 120 through which the first transparent conductive line 341 passes may be the same or different. The eighth sub-pixel region 373 may be a normal sub-pixel region 120A or a dummy sub-pixel region 120B.

The fourth transparent conductive line 371 extends from the seventh sub-pixel region 372 to the second region AA2 through the eighth sub-pixel region 373, thereby transmitting a signal of a pixel driving circuit 111 to a light-emitting device 112 in the second region AA2. It will be noted that the seventh sub-pixel region 372 and the first sub-pixel region 342 are different sub-pixel regions 120. For example, the second sub-pixel region 343, the fourth sub-pixel region 353, the sixth sub-pixel region 363 and the eighth sub-pixel region 373 may be different sub-pixel regions 120. Alternatively, a part of the second sub-pixel region 343, the fourth sub-pixel region 353, the sixth sub-pixel region 363 and the eighth sub-pixel region 373 may be a same sub-pixel region 120. Alternatively, all of the second sub-pixel region 343, the fourth sub-pixel region 353, the sixth sub-pixel region 363 and the eighth sub-pixel region 373 may be a same sub-pixel region 120.

Based on this, the fourth transparent conductive line 371 may connect a pixel driving circuit 111 in a dummy sub-pixel region 120B in the first region AA1 and a light-emitting device 112 located in the second region AA2. As for connection manners of two ends of the fourth transparent conductive line 371, reference may be made to the first transparent conductive line 341, the second transparent conductive line 351 and the third transparent conductive line 361, which will not be repeated here.

As shown in FIG. 17, an orthographic projection of the fourth transparent conductive line 371 on the substrate 310 is non-overlapping with orthogonal projections, on the substrate 310, of all via holes 321, in the eighth sub-pixel region 373, of the insulating layer 320. For convenience of description, the orthographic projection of the fourth transparent conductive line 371 on the substrate 310 is referred to as a fourth orthographic projection. The fourth orthographic projection is non-overlapping with an orthogonal projection, on the substrate 310, of a certain via hole 321 in the eighth sub-pixel region 373, which may mean that the fourth transparent conductive line 371 does not pass above the via hole 321. As an example, the fourth orthographic projection is non-overlapping with an orthogonal projection, on the substrate 310, of each via hole 321, in each sub-pixel regions 120 through which the fourth transparent conductive line 371 passes, of the insulating layer 320. That is, the fourth transparent conductive line 371 does not pass above any via hole 321, in all the sub-pixel regions 120 through which the fourth transparent conductive line 371 passes, of the insulating layer 320. In this way, it is possible to reduce or avoid the influence, on the fourth transparent conductive line 371, of the function of gathering light by the structure 331 similar to the concave mirror, so that a width of the fourth transparent conductive line 371 is Uniform. As a result, the display effect in the second region AA2 is ensured.

The fourth transparent conductive layer 370 is located above the second transparent conductive layer 350, and the influence of the structure 331 similar to the concave mirror on the width of the second transparent conductive line 351 is relatively small, and thus the influence of the structure 331 similar to the concave mirror on the width of the fourth transparent conductive line 371 is reduced. Even if the fourth transparent conductive line 371 passes above the via hole 321, the fourth transparent conductive line 371 is not prone to be affected by the structure 331 similar to the concave mirror, so that a probability that the width is decreased or a degree to which the width of the fourth transparent conductive line 371 is decreased is reduced. Therefore, an arrangement position of the fourth transparent conductive line 371 is not limited by the via hole 321, which may avoid the via hole 321 or pass above the via hole 321.

For example, referring to FIG. 17, the orthographic projection of the fourth transparent conductive line 371 on the substrate 310 is non-overlapping with the orthogonal projections, on the substrate 310, of all the via hole 321, in the eighth sub-pixel region 373, of the insulating layer 320. That is, the fourth transparent conductive line 371 does not pass above any via hole 321, in any sub-pixel region 120 through which the fourth transparent conductive line 371 passes. Thus, it is possible to reduce or avoid the influence, on the fourth transparent conductive line 371, of the function of gathering light by the structure 331 similar to the concave mirror, so that the width of the fourth transparent conductive line 371 is uniform. As a result, the display effect in the second region AA2 is ensured.

For example, referring to FIG. 18, the orthographic projection of the fourth transparent conductive line 371 on the substrate 310 overlaps with an orthogonal projection, on the substrate 310, of at least part of the via holes 321, in the eighth sub-pixel region 373, of the insulating layer 320. For convenience of description, the orthographic projection of the fourth transparent conductive line 371 on the substrate 310 is referred to as the fourth orthographic projection. In a case where the eighth sub-pixel region 373 and the fourth sub-pixel region 353 are a same sub-pixel region 120, the fourth transparent conductive line 371 and the second transparent conductive line 351 each pass above the at least part of the via holes 321 in the eighth sub-pixel region 373, and the first transparent conductive line 341 avoids all the via holes 321 in the eighth sub-pixel region 373. Therefore, in the eighth sub-pixel region 373, an overlapping degree between the fourth orthographic projection and the second orthographic projection is greater than an overlapping degree between the fourth orthographic projection and the first orthographic projection. Therefore, in the eighth sub-pixel region 373, an overlapping degree between the fourth transparent conductive line 371 and the second transparent conductive line 351 is greater than an overlapping degree between the fourth transparent conductive line 371 and the first transparent conductive line 341.

The fourth orthographic projection overlaps with the orthogonal projection, on the substrate 310, of the at least part of the via holes 321, in the eighth sub-pixel region 373, of the insulating layer 320. The fourth transparent conductive line 371 is arranged to pass above the via hole 321, which fully utilizes a space above the via hole 321; a distribution of the transparent conductive lines in the eighth sub-pixel region 373 is relatively uniform, which avoids a problem, caused by a fact that an excessive number of transparent conductive lines are distributed in a region avoiding the via hole 321, that a lot of transparent conductive lines are stacked on the first transparent conductive line 341. Moreover, even if the fourth transparent conductive line 371 passes above the via hole 321, the structure 331 similar to the concave mirror has little influence on the fourth transparent conductive line 371.

It will be noted that, in the same sub-pixel region, the width of the fourth transparent conductive line 371 may be greater than, equal to or less than the width of the first transparent conductive line 341, which is not limited herein; in the same sub-pixel region, the width of the fourth transparent conductive line 371 may be greater than, equal to or less than the width of the third transparent conductive line 361, which is not limited herein; in the same sub-pixel region, the width of the fourth transparent conductive line 371 may be equal to or less than the width of the second transparent conductive line 351, which is not limited herein.

In some embodiments, as shown in FIGS. 9, 11, 13, 17 and 18, the first transparent conductive layer 340 and the metal layer 330 are adjacent conductive layers. Thus, a distance between the first transparent conductive layer 340 and the structure 331 similar to the concave mirror is relatively small, so that it is necessary for the first transparent conductive line 341 to avoid above each via hole 321.

In some embodiments, as shown in FIG. 7, the display panel 100 further includes a first light-emitting device 112A and a second light-emitting device 112B. The first light-emitting device 112A and the second light-emitting device 112B are both located in the second region AA2. The first light-emitting device 112A is coupled to the first transparent conductive line 341. The second light-emitting device 112B is coupled to the second transparent conductive line 351.

The first light-emitting device 112A is electrically connected to the first transparent conductive line 341. The first transparent conductive line 341 transmits a current signal to the first light-emitting device 112A, so that the first light-emitting device 112A emits light according to the current signal. The second light-emitting device 112B is electrically connected to the second transparent conductive line 351. The second transparent conductive line 351 transmits another current signal to the second light-emitting device 112B, so that the second light-emitting device 112B emits light according to the another current signal.

In some embodiments, as shown in FIG. 5, the plurality of sub-pixel regions 120 further include a plurality of ninth sub-pixel regions. The display panel 100 further includes a plurality of third light-emitting devices 112C located in the first region AA1, and each third light-emitting device 112C is coupled in a ninth sub-pixel region.

The ninth sub-pixel region is a normal sub-pixel region 120A. A pixel driving circuit 111A is disposed in the ninth sub-pixel region of the display panel 100, a light-emitting device 112C coupled to the pixel driving circuit 111A and the pixel driving circuit 111A are both located in the first region AA1, and all or a portion of the light-emitting device 112C may be located in the normal sub-pixel region 120A.

It will be noted that the dummy sub-pixel regions 120B may be distributed among the normal sub-pixel regions 120A. For example, in a same row or a same column of sub-pixel regions 120, there are a part (e.g., 5, 8 or 12) of the normal sub-pixel regions 120A arranged between two dummy sub-pixel regions 120B that are the closest.

In another aspect, a display apparatus is provided. The display apparatus includes the display panel 100 and the sensor 200 that are each as described in any one of the above embodiments. The sensor 200 is disposed on the non-display side 100B of the display panel 100, and an orthographic projection of the sensor 200 on the display panel 100 overlaps with the second region AA2.

In yet another aspect, a method of manufacturing a display panel 100 is provided. The display panel 100 has a display region AA, and the display region AA includes a first region AA1 and a second region AA2 that are non-overlapping with each other. The first region AA1 includes a plurality of sub-pixel regions 120.

Figure 19:
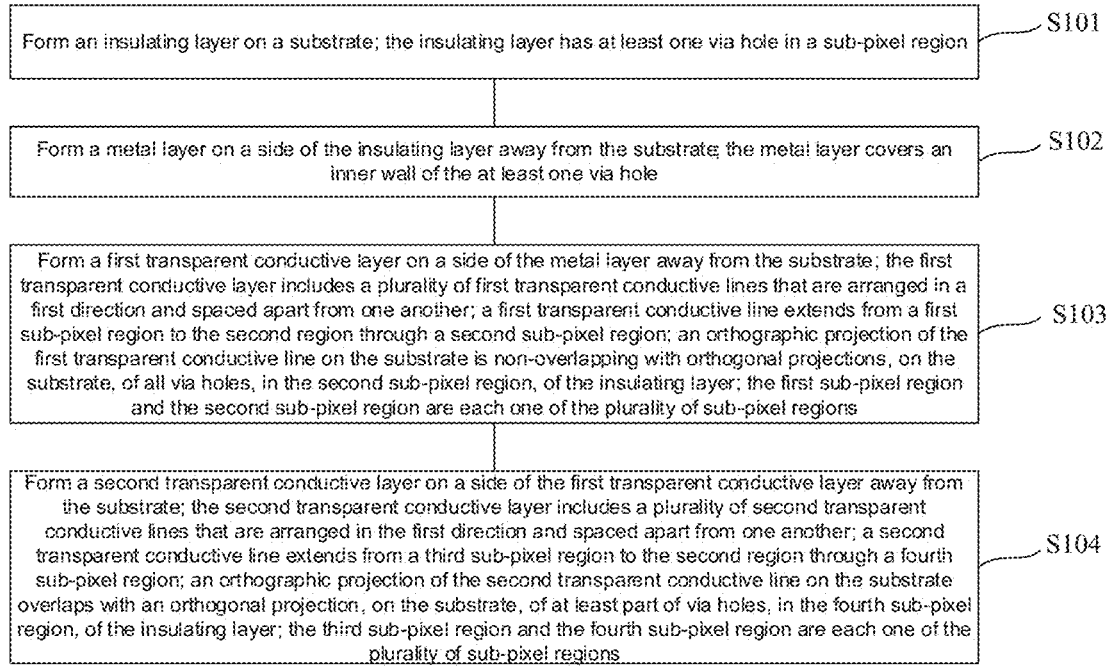
FIG. 19 is a flow diagram of a method of manufacturing a display panel, in accordance with some embodiments.
Figure 20A:
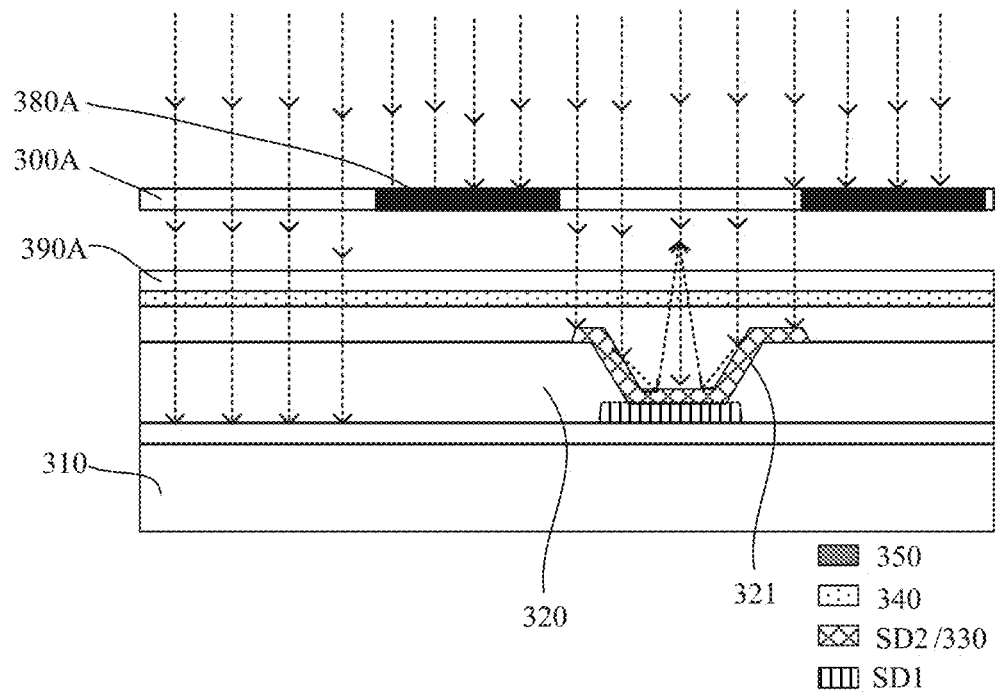
FIG. 20A is a diagram showing a light path of exposure by using a first mask, in accordance with some embodiments.
Figure 20B:
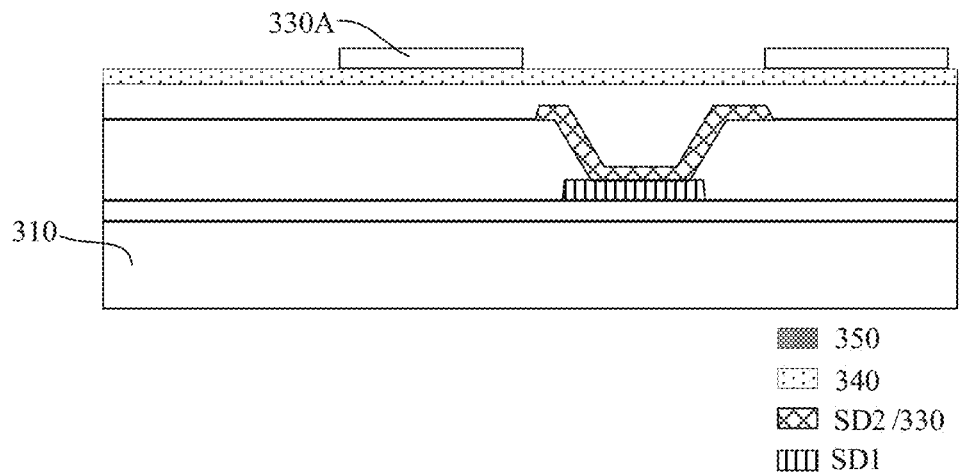
FIG. 20B is a structural diagram of a first photoresist pattern layer, in accordance with some embodiments.
Figure 20C:
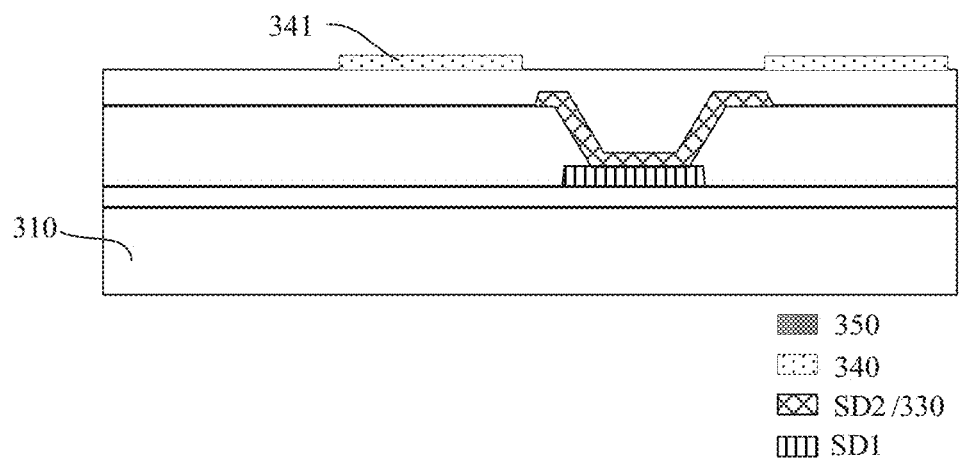
FIG. 20C is a structural diagram of a first transparent conductive layer, in accordance with some embodiments.
Figure 20D:
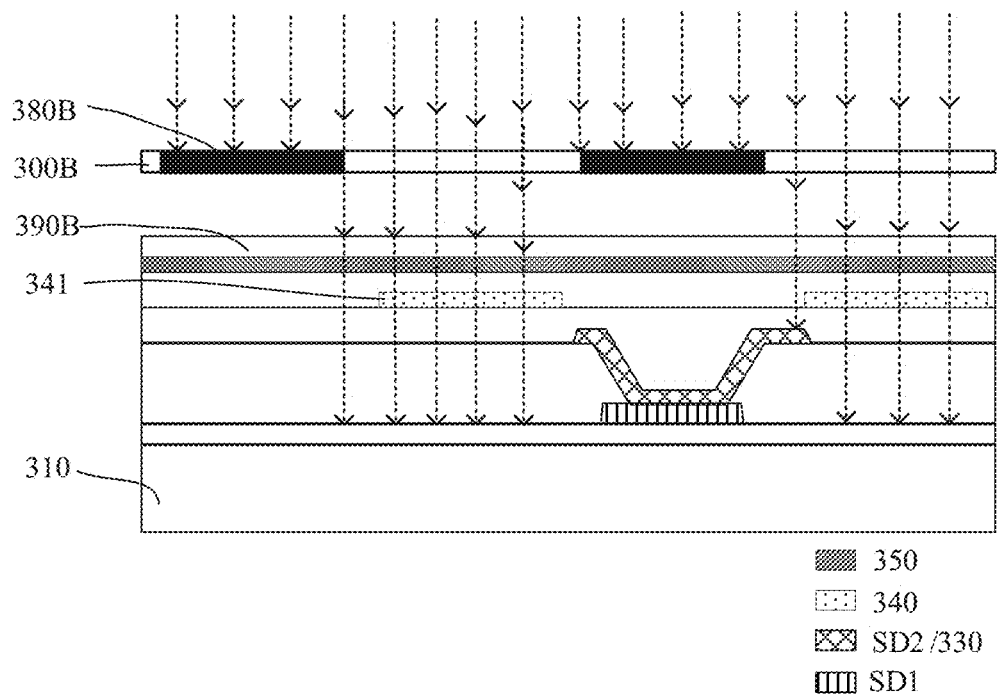
FIG. 20D is a diagram showing a light path of exposure by using a second mask, in accordance with some embodiments.
Figure 20E:
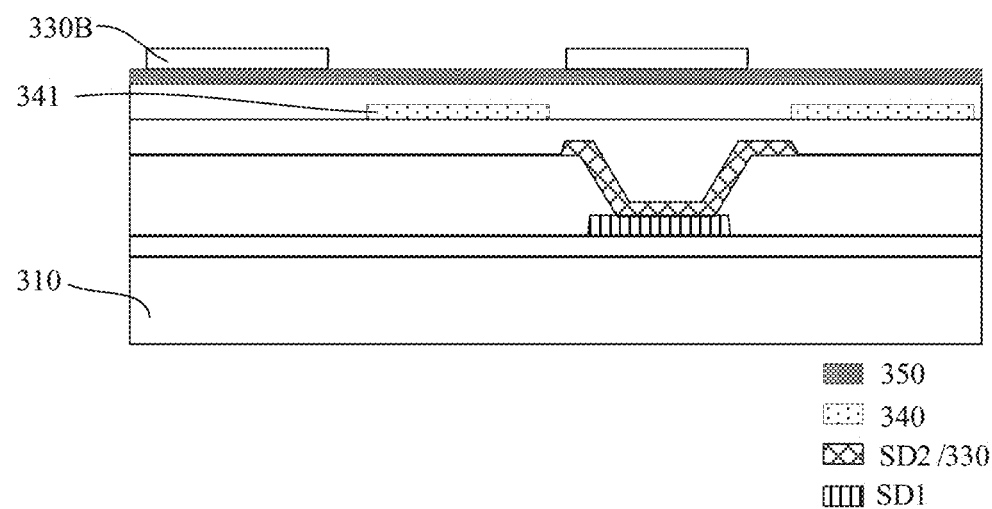
FIG. 20E is a structural diagram of a second photoresist pattern layer, in accordance with some embodiments.
Figure 20F:
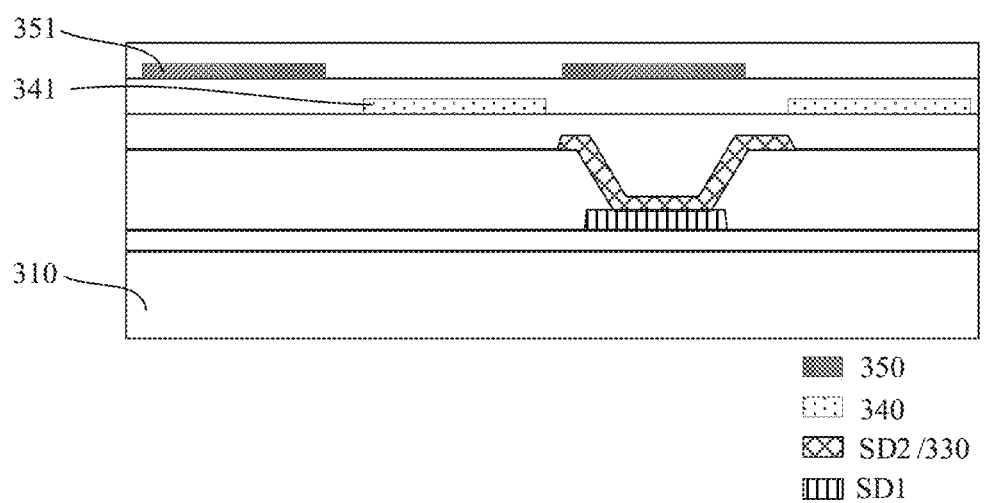
FIG. 20F is a structural diagram of a second transparent conductive layer, in accordance with some embodiments.

FIG. 19 is a flow diagram of the method of manufacturing the display panel. FIG. 20A is a diagram showing a light path of exposure by using a first mask. FIG. 20B is a structural diagram of a formed first photoresist pattern layer. FIG. 20C is a structural diagram of a formed first transparent conductive layer. FIG. 20D is a diagram showing a light path of exposure by using a second mask. FIG. 20E is a structural diagram of a formed second photoresist pattern layer. FIG. 20F is a structural diagram of a formed second transparent conductive layer.

Referring to FIGS. 19 to 20F, the method of manufacturing the display panel 100 includes following steps.

In S101, an insulating layer 320 (as shown in FIG. 20A) is formed on a substrate 310, and the insulating layer 320 has at least one via hole 321 in a sub-pixel region 120.

In S102, a metal layer 330 is formed on a side of the insulating layer 320 away from the substrate 310, and the metal layer 330 covers an inner wall of the at least one via hole 321.

In S103, a first transparent conductive layer 340 is formed on a side of the metal layer 330 away from the substrate 310; the first transparent conductive layer 340 includes a plurality of first transparent conductive lines 341 that are arranged in a first direction X and spaced apart from one another; a first transparent conductive line 341 extends from a first sub-pixel region 342 to the second region AA2 through a second sub-pixel region 343; an orthographic projection of the first transparent conductive line 341 on the substrate 310 is non-overlapping with orthogonal projections, on the substrate 310, of all via holes 321, in the second sub-pixel region 343, of the insulating layer 320; the first sub-pixel region 342 and the second sub-pixel region 343 are each one of the plurality of sub-pixel regions 120.

In S104, a second transparent conductive layer 350 is formed on a side of the first transparent conductive layer 340 away from the substrate 310; the second transparent conductive layer 350 includes a plurality of second transparent conductive lines 351 that are arranged in the first direction X and spaced apart from one another: a second transparent conductive line 351 extends from a third sub-pixel region 352 to the second region AA2 through a fourth sub-pixel region 353; an orthographic projection of the second transparent conductive line 351 on the substrate 310 overlaps with an orthogonal projection, on the substrate 310, of at least part of via holes 321, in the fourth sub-pixel region 353, of the insulating layer 320; the third sub-pixel region 352 and the fourth sub-pixel region 353 are each one of the plurality of sub-pixel regions 120.

In some embodiments, forming the first transparent conductive layer 340 on the side of the metal layer 330 away from the substrate 310 includes:

forming a transparent conductive film on the side of the metal layer 330 away from the substrate 310; forming a first positive photoresist film 390A on a surface of the transparent conductive film; performing exposure, by using a first mask 300A, and development on the first positive photoresist film 390A to obtain a first photoresist pattern layer 330A, the first mask 300A including a plurality of first linear shielding bars 380A; and removing a portion of the transparent conductive film not protected by the first photoresist pattern layer 330A to obtain the first transparent conductive layer 340 including the plurality of first transparent conductive lines 341. A first linear shielding bar 380A corresponds to the first transparent conductive line 341.

Forming the second transparent conductive layer 350 on the side of the first transparent conductive layer 340 away from the substrate 310 includes:

forming another transparent conductive film on the side of the first transparent conductive layer 340 away from the substrate 310;
forming a second positive photoresist film 390B on a surface of the another transparent conductive film; performing exposure, by using a second mask 300B, and development on the second positive photoresist film 390B to obtain a second photoresist pattern layer 3308, the second mask 300B including a plurality of second linear shielding bars 380B; and removing a portion of the another transparent conductive film not protected by the second photoresist pattern layer 3308 to obtain the second transparent conductive layer 350 including the plurality of second transparent conductive lines 351. A second linear shielding bar 380B corresponds to the second transparent conductive line 351.

A maximum width of the second linear shielding bar 380B corresponding to the fourth sub-pixel region 353 is greater than a width of the first linear shielding bar 380A corresponding to the second sub-pixel region 343.

Firstly, referring to FIG. 20A, a transparent conductive material is deposited, by a process such as sputtering or CVD, on the side of the metal layer 330 away from the substrate 310, so as to form the transparent conductive film. After that, the transparent conductive film may be coated with a first positive photoresist, so as to form the first positive photoresist film 390A. Then, exposure may be performed on the positive photoresist by using the first mask 300A.

The first mask 300A includes the plurality of first linear shielding bars 380A, and a first linear shielding bar 380A corresponds to a first transparent conductive line 341. During a process of the exposure, the first linear shielding bars 380A of the first mask 300A may prevent light from entering the first positive photoresist film 390A. Thus, portions of the first positive photoresist film 390A corresponding to the first linear shielding bars 380A are unexposed regions, and remaining regions are exposed regions.

Referring to FIG. 20B, development is performed on the exposed first positive photoresist film 390A, the exposed regions of the first positive photoresist film 390A are dissolved in a photoresist developer, and the unexposed regions are remained, so that the first photoresist pattern layer 330A is formed.

Next, referring to FIG. 20C, a portion of the transparent conductive film not protected by the first photoresist pattern layer 330A is removed (for example, the transparent conductive film may be etched by using an etching solution), so as to obtain the first transparent conductive layer 340 including the plurality of first transparent conductive lines 341.

Then, an insulating material layer is provided on the first transparent conductive layer 340. Referring to FIG. 20D, a transparent conductive material is deposited, by a process such as sputtering or CVD, on the side of the first transparent conductive layer 340 away from the substrate 310, so as to form the another transparent conductive film. After that, the another transparent conductive film may be coated with a second positive photoresist, so as to form the second positive photoresist film 390B. Then, exposure may be performed on the positive photoresist by using the second mask 300B. The first positive photoresist and the second positive photoresist may be the same or different.

The second mask 3008 includes the plurality of second linear shielding bars 3808, and a second linear shielding bar 3808 corresponds to a second transparent conductive line 351. During a process of the exposure, the second linear shielding bars 380B of the second mask 300B may prevent light from entering the second positive photoresist film 390B. Thus, portions of the second positive photoresist film 3908B corresponding to the second linear shielding bars 380B are unexposed regions, and remaining regions are exposed regions.

Referring to FIG. 20B, development is performed on the exposed second positive photoresist film 390B, the exposed regions of the second positive photoresist film 390B are dissolved in a photoresist developer, and the unexposed regions are remained, so that the second photoresist pattern layer 3308 is formed.

Next, referring to FIG. 20F, a portion of the another transparent conductive film not protected by the second photoresist pattern layer 330B is removed (for example, the another transparent conductive film may be etched by using an etching solution), so as to obtain the second transparent conductive layer 350 including the plurality of second transparent conductive lines 351.

The method of manufacturing the display panel may achieve beneficial effects the same as that of the display panel, which will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display region; the display region including a first region and a second region that are non-overlapping with each other, and the first region including a plurality of sub-pixel regions; the display panel comprising:
   a substrate;
   an insulating layer disposed on the substrate; the insulating layer having at least one via hole in a sub-pixel region;
   a metal layer disposed on a side of the insulating layer away from the substrate; the metal layer covering an inner wall of the at least one via hole;
   a first transparent conductive layer disposed on a side of the metal layer away from the substrate; wherein the first transparent conductive layer includes a plurality of first transparent conductive lines that are arranged in a first direction and spaced apart from one another; a first transparent conductive line extends from a first sub-pixel region to the second region through a second sub-pixel region, and the first sub-pixel region and the second sub-pixel region are each one of the plurality of sub-pixel regions; the insulating layer has at least one via hole in the second sub-pixel region, and the metal layer covers an inner wall of the at least one via hole in the second sub-pixel region; and
   a second transparent conductive layer disposed on a side of the first transparent conductive layer away from the substrate; wherein the second transparent conductive layer includes a plurality of second transparent conductive lines that are arranged in the first direction and spaced apart from one another; a second transparent conductive line extends from a third sub-pixel region to the second region through a fourth sub-pixel region, and the third sub-pixel region and the fourth sub-pixel region are each one of the plurality of sub-pixel regions; the insulating layer has at least one via hole in the fourth sub-pixel region, and the metal layer covers an inner wall of the at least one via hole in the fourth sub-pixel region;
   wherein a total overlapping area between an orthographic projection of the first transparent conductive line on the substrate and orthogonal projections, on the substrate, of all via holes, in the second sub-pixel region, of the insulating layer is less than a total overlapping area between an orthographic projection of the second transparent conductive line on the substrate and orthogonal projections, on the substrate, of all via holes, in the fourth sub-pixel region, of the insulating layer.

2. The display panel according to claim 1, wherein the orthographic projection of the first transparent conductive line on the substrate is non-overlapping with the orthogonal projections, on the substrate, of all the via holes, in the second sub-pixel region, of the insulating layer; and
   the orthographic projection of the second transparent conductive line on the substrate overlaps with an orthogonal projection, on the substrate, of at least part of the via holes, in the fourth sub-pixel region, of the insulating layer.

3. The display panel according to claim 2, wherein the first transparent conductive layer and the metal layer are adjacent conductive layers.

4. The display panel according to claim 1, wherein an orthographic projection, on the substrate, of at least part of the via holes, in the fourth sub-pixel region, of the insulating layer is located within the orthographic projection of the second transparent conductive line on the substrate.

5. The display panel according to claim 1, wherein a maximum width of the second transparent conductive line in the fourth sub-pixel region is greater than a width of the first transparent conductive line in the second sub-pixel region.

6. The display panel according to claim 1, wherein a portion of the second transparent conductive line in the fourth sub-pixel region includes a first section and a second section that are distributed in a second direction and connected to each other; the second direction is an extending direction of the second transparent conductive line; an orthographic projection of the first section on the substrate overlaps with an orthogonal projection, on the substrate, of at least part of the via holes, in the fourth sub-pixel region, of the insulating layer; an orthographic projection of the second section on the substrate is non-overlapping with the orthogonal projections, on the substrate, of all the via holes, in the fourth sub-pixel region, of the insulating layer;
   a maximum width of the first section is greater than a width of the second section.

7. The display panel according to claim 6, wherein the maximum width of the first section is greater than a width of the first transparent conductive line in the second sub-pixel region; or
   a maximum width of the second section is equal to the width of the first transparent conductive line in the second sub-pixel region.

8. The display panel according to claim 6, wherein
   the maximum width of the first section is greater than a width of the first transparent conductive line in the second sub-pixel region; a maximum width of the second section is equal to the width of the first transparent conductive line in the second sub-pixel region.

9. The display panel according to claim 1, wherein the orthographic projection of the first transparent conductive line on the substrate is non-overlapping with orthographic projections of the plurality of second transparent conductive lines on the substrate.

10. The display panel according to claim 1, wherein the plurality of first transparent conductive lines and the plurality of second transparent conductive lines are alternately arranged in the first direction.

11. The display panel according to claim 1, wherein a distance, in a direction perpendicular to the substrate, between the second transparent conductive line and the insulating layer is greater than or equal to 4.5 μm.

12. The display panel according to claim 1, further comprising:
    a third transparent conductive layer disposed between the first transparent conductive layer and the second transparent conductive layer; wherein the third transparent conductive layer includes a plurality of third transparent conductive lines that are arranged in the first direction and spaced apart from one another;
    a third transparent conductive line extends from a fifth sub-pixel region to the second region through a sixth sub-pixel region; an orthographic projection of the third transparent conductive line on the substrate is non-overlapping with orthogonal projections, on the substrate, of all via holes, in the sixth sub-pixel region, of the insulating layer; the fifth sub-pixel region and the sixth sub-pixel region are each one of the plurality of sub-pixel regions; the insulating layer has at least one via hole in the sixth sub-pixel region, and the metal layer covers an inner wall of the at least one via hole in the sixth sub-pixel region.

13. The display panel according to claim 12, wherein the sixth sub-pixel region and the second sub-pixel region are a same sub-pixel region; in the second sub-pixel region, the orthographic projection of the third transparent conductive line on the substrate overlaps with the orthographic projection of the first transparent conductive line on the substrate.

14. The display panel according to claim 1, further comprising:
- a fourth transparent conductive layer located on the second transparent conductive layer; wherein the fourth transparent conductive layer includes a plurality of fourth transparent conductive lines that are arranged in the first direction and spaced apart from one another;
- a fourth transparent conductive line extends from a seventh sub-pixel region to the second region through an eighth sub-pixel region, and the seventh sub-pixel region and the eighth sub-pixel region are each one of the plurality of sub-pixel regions; the insulating layer has at least one via hole in the eighth sub-pixel region, and the metal layer covers an inner wall of the at least one via hole in the eighth sub-pixel region; an orthographic projection of the fourth transparent conductive line on the substrate is non-overlapping with orthogonal projections, on the substrate, of all via holes, in the eighth sub-pixel region, of the insulating layer; or
- the orthographic projection of the fourth transparent conductive line on the substrate overlaps with an orthogonal projection, on the substrate, of at least part of the via holes, in the eighth sub-pixel region, of the insulating layer.

15. The display panel according to claim 1, further comprising:
- a first light-emitting device and a second light-emitting device; wherein the first light-emitting device and the second light-emitting device are both located in the second region, the first light-emitting device is coupled to the first transparent conductive line, and the second light-emitting device is coupled to the second transparent conductive line.

16. The display panel according to claim 1, wherein the plurality of sub-pixel regions further include a plurality of ninth sub-pixel regions;
- the display panel further comprises a plurality of third light-emitting devices located in the first region, and each third light-emitting device is coupled in a ninth sub-pixel region.

17. A display apparatus, comprising:
the display panel according to claim 1; and
a sensor disposed on a non-display side of the display panel; wherein an orthographic projection of the sensor on the display panel overlaps with the second region of the display panel.

18. The display apparatus according to claim 17, wherein the orthographic projection of the first transparent conductive line on the substrate is non-overlapping with the orthogonal projections, on the substrate, of all the via holes, in the second sub-pixel region, of the insulating layer; and
the orthographic projection of the second transparent conductive line on the substrate overlaps with an orthogonal projection, on the substrate, of at least part of the via holes, in the fourth sub-pixel region, of the insulating layer.

19. A method of manufacturing a display panel, the display panel having a display region; the display region including a first region and a second region that are non-overlapping with each other, and the first region including a plurality of sub-pixel regions; the method of manufacturing the display panel comprising:
- forming an insulating layer on a substrate; the insulating layer having at least one via hole in a sub-pixel region;
- forming a metal layer on a side of the insulating layer away from the substrate; the metal layer covering an inner wall of the at least one via hole;
- forming a first transparent conductive layer on a side of the metal layer away from the substrate; wherein the first transparent conductive layer includes a plurality of first transparent conductive lines that are arranged in a first direction and spaced apart from one another; a first transparent conductive line extends from a first sub-pixel region to the second region through a second sub-pixel region; an orthographic projection of the first transparent conductive line on the substrate is non-overlapping with orthogonal projections, on the substrate, of all via holes, in the second sub-pixel region, of the insulating layer; the first sub-pixel region and the second sub-pixel region are each one of the plurality of sub-pixel regions; the insulating layer has at least one via hole in the second sub-pixel region, and the metal layer covers an inner wall of the at least one via hole in the second sub-pixel region; and
- forming a second transparent conductive layer on a side of the first transparent conductive layer away from the substrate; wherein the second transparent conductive layer includes a plurality of second transparent conductive lines that are arranged in the first direction and spaced apart from one another; a second transparent conductive line extends from a third sub-pixel region to the second region through a fourth sub-pixel region; an orthographic projection of the second transparent conductive line on the substrate overlaps with an orthogonal projection, on the substrate, of at least part of via holes, in the fourth sub-pixel region, of the insulating layer; the third sub-pixel region and the fourth sub-pixel region are each one of the plurality of sub-pixel regions; the insulating layer has at least one via hole in the fourth sub-pixel region, and the metal layer covers an inner wall of the at least one via hole in the fourth sub-pixel region.

20. The method of manufacturing the display panel according to claim 19, wherein forming the first transparent conductive layer on the side of the metal layer away from the substrate includes:
- forming a transparent conductive film on the side of the metal layer away from the substrate;
- forming a first positive photoresist film on a surface of the transparent conductive film;
- performing exposure, by using a first mask, and development on the first positive photoresist film to obtain a first photoresist pattern layer, the first mask including a plurality of first linear shielding bars; and
- removing a portion of the transparent conductive film not protected by the first photoresist pattern layer to obtain the first transparent conductive layer including the plurality of first transparent conductive lines; wherein a first linear shielding bar corresponds to the first transparent conductive line; and forming the second transparent conductive layer on the side of the first transparent conductive layer away from the substrate includes:
- forming another transparent conductive film on the side of the first transparent conductive layer away from the substrate;
- forming a second positive photoresist film on a surface of the another transparent conductive film;

performing exposure, by using a second mask, and development on the second positive photoresist film to obtain a second photoresist pattern layer, the second mask including a plurality of second linear shielding bars; and removing a portion of the another transparent conductive film not protected by the second photoresist pattern layer to obtain the second transparent conductive layer including the plurality of second transparent conductive lines;

wherein a second linear shielding bar corresponds to the second transparent conductive line;

wherein a maximum width of the second linear shielding bar corresponding to the fourth sub-pixel region is greater than a width of the first linear shielding bar corresponding to the second sub-pixel region.

* * * * *